(12) United States Patent
Bertness (10) Patent No.: US 7,772,850 B2
(45) Date of Patent: *Aug. 10, 2010

(54) WIRELESS BATTERY TESTER WITH INFORMATION ENCRYPTION MEANS

(75) Inventor: Kevin I. Bertness, Batavia, IL (US)

(73) Assignee: Midtronics, Inc., Willowbrook, IL (US)

( * ) Notice: Subject to any disclaimer, the term of this patent is extended or adjusted under 35 U.S.C. 154(b) by 1188 days.

This patent is subject to a terminal disclaimer.

(21) Appl. No.: 11/178,550

(22) Filed: Jul. 11, 2005

(65) Prior Publication Data

US 2006/0006876 A1    Jan. 12, 2006

Related U.S. Application Data

(60) Provisional application No. 60/587,232, filed on Jul. 12, 2004.

(51) Int. Cl.
  *G01N 27/416*   (2006.01)
  *H02J 7/00*     (2006.01)
(52) U.S. Cl. .......... 324/426; 324/430; 320/136
(58) Field of Classification Search .......... 324/426, 324/430; 320/132, 136
  See application file for complete search history.

(56) References Cited

U.S. PATENT DOCUMENTS

| | | | |
|---|---|---|---|
| 2,000,665 A | 5/1935 | Neal | 439/440 |
| 2,417,940 A | 3/1947 | Lehman | 200/61.25 |
| 2,514,745 A | 7/1950 | Dalzell | 324/115 |
| 2,727,221 A | 12/1955 | Springg | 340/447 |
| 3,178,686 A | 4/1965 | Mills | 340/447 |
| 3,223,969 A | 12/1965 | Alexander | 340/447 |
| 3,267,452 A | 8/1966 | Wolf | 340/249 |
| 3,356,936 A | 12/1967 | Smith | 324/429 |
| 3,562,634 A | 2/1971 | Latner | 324/427 |
| 3,593,099 A | 7/1971 | Scholl | 320/127 |
| 3,607,673 A | 9/1971 | Seyl | 324/425 |
| 3,652,341 A | 3/1972 | Halsall et al. | 29/623.2 |
| 3,676,770 A | 7/1972 | Sharaf et al. | 324/430 |
| 3,729,989 A | 5/1973 | Little | 73/862.192 |
| 3,750,011 A | 7/1973 | Kreps | 324/430 |

(Continued)

FOREIGN PATENT DOCUMENTS

DE    29 26 716 B1    1/1981

(Continued)

OTHER PUBLICATIONS

"Electrochemical Impedance Spectroscopy in Battery Development and Testing", *Batteries International*, Apr. 1997, pp. 59 and 62-63.

(Continued)

*Primary Examiner*—Edward Tso
*Assistant Examiner*—Richard V Muralidar
(74) *Attorney, Agent, or Firm*—Westman, Champlin & Kelly P.A.

(57) ABSTRACT

An electronic battery tester and method includes generating battery test data from an electronic battery test. The battery test data is transmitted over a wireless communication medium. In another aspect, a method and apparatus is provided for receiving battery test data from a wireless communication medium. Also, a diagnostic battery charger, which is capable of transmitting battery condition information to an external receiver, is provided.

19 Claims, 6 Drawing Sheets

U.S. PATENT DOCUMENTS

| | | | |
|---|---|---|---|
| 3,753,094 A | 8/1973 | Furuishi et al. | 324/430 |
| 3,776,177 A | 12/1973 | Bryant et al. | 116/311 |
| 3,796,124 A | 3/1974 | Crosa | 411/521 |
| 3,808,522 A | 4/1974 | Sharaf | 324/430 |
| 3,811,089 A | 5/1974 | Strezelewicz | 324/170 |
| 3,816,805 A | 6/1974 | Terry | 320/123 |
| 3,850,490 A | 11/1974 | Zehr | 439/822 |
| 3,873,911 A | 3/1975 | Champlin | 324/430 |
| 3,876,931 A | 4/1975 | Godshalk | 324/429 |
| 3,886,426 A | 5/1975 | Daggett | 320/117 |
| 3,886,443 A | 5/1975 | Miyakawa et al. | 324/426 |
| 3,889,248 A | 6/1975 | Ritter | 340/636.11 |
| 3,906,329 A | 9/1975 | Bader | 320/134 |
| 3,909,708 A | 9/1975 | Champlin | 324/431 |
| 3,936,744 A | 2/1976 | Perlmutter | 324/772 |
| 3,946,299 A | 3/1976 | Christianson et al. | 320/430 |
| 3,947,757 A | 3/1976 | Grube et al. | 324/416 |
| 3,969,667 A | 7/1976 | McWilliams | 324/427 |
| 3,979,664 A | 9/1976 | Harris | 324/397 |
| 3,984,762 A | 10/1976 | Dowgiallo, Jr. | 324/430 |
| 3,984,768 A | 10/1976 | Staples | 324/712 |
| 3,989,544 A | 11/1976 | Santo | 429/65 |
| 4,008,619 A | 2/1977 | Alcaide et al. | 73/724 |
| 4,023,882 A | 5/1977 | Pettersson | 439/426 |
| 4,024,953 A | 5/1977 | Nailor, III | 206/344 |
| 4,047,091 A | 9/1977 | Hutchines et al. | 363/59 |
| 4,053,824 A | 10/1977 | Dupuis et al. | 324/434 |
| 4,056,764 A | 11/1977 | Endo et al. | 320/101 |
| 4,057,313 A | 11/1977 | Polizzano | 439/219 |
| 4,070,624 A | 1/1978 | Taylor | 324/772 |
| 4,086,531 A | 4/1978 | Bernier | 324/772 |
| 4,106,025 A | 8/1978 | Katz | 343/715 |
| 4,112,351 A | 9/1978 | Back et al. | 324/380 |
| 4,114,083 A | 9/1978 | Benham et al. | 340/636.15 |
| 4,126,874 A | 11/1978 | Suzuki et al. | 396/301 |
| 4,160,916 A | 7/1979 | Papasideris | 307/10.6 |
| 4,178,546 A | 12/1979 | Hulls et al. | 324/772 |
| 4,193,025 A | 3/1980 | Frailing et al. | 324/427 |
| 4,207,611 A | 6/1980 | Gordon | 701/33 |
| 4,217,645 A | 8/1980 | Barry et al. | 702/63 |
| 4,280,457 A | 7/1981 | Bloxham | 123/198 R |
| 4,297,639 A | 10/1981 | Branham | 324/429 |
| 4,307,342 A | 12/1981 | Peterson | 324/767 |
| 4,315,204 A | 2/1982 | Sievers et al. | 322/28 |
| 4,316,185 A | 2/1982 | Watrous et al. | 320/116.11 |
| 4,322,685 A | 3/1982 | Frailing et al. | 324/429 |
| 4,351,405 A | 9/1982 | Fields et al. | 180/65.2 |
| 4,352,067 A | 9/1982 | Ottone | 324/434 |
| 4,360,780 A | 11/1982 | Skutch, Jr. | 324/437 |
| 4,361,809 A | 11/1982 | Bil et al. | 324/426 |
| 4,363,407 A | 12/1982 | Buckler et al. | 209/3.3 |
| 4,369,407 A | 1/1983 | Korbell | 324/416 |
| 4,379,989 A | 4/1983 | Kurz et al. | 320/165 |
| 4,379,990 A | 4/1983 | Sievers et al. | 322/99 |
| 4,385,269 A | 5/1983 | Aspinwall et al. | 320/129 |
| 4,390,828 A | 6/1983 | Converse et al. | 320/153 |
| 4,392,101 A | 7/1983 | Saar et al. | 320/156 |
| 4,396,880 A | 8/1983 | Windebank | 320/156 |
| 4,408,157 A | 10/1983 | Beaubien | 324/712 |
| 4,412,169 A | 10/1983 | Dell'Orto | 320/123 |
| 4,423,378 A | 12/1983 | Marino et al. | 324/427 |
| 4,423,379 A | 12/1983 | Jacobs et al. | 324/429 |
| 4,424,491 A | 1/1984 | Bobbett et al. | 324/433 |
| 4,441,359 A | 4/1984 | Ezoe | 73/116.06 |
| 4,459,548 A | 7/1984 | Lentz et al. | 324/472 |
| 4,514,694 A | 4/1985 | Finger | 324/429 |
| 4,520,353 A | 5/1985 | McAuliffe | 340/636.16 |
| 4,521,498 A | 6/1985 | Juergens | 429/59 |
| 4,564,798 A | 1/1986 | Young | 320/103 |
| 4,620,767 A | 11/1986 | Woolf | 439/217 |
| 4,633,418 A | 12/1986 | Bishop | 702/63 |
| 4,637,359 A | 1/1987 | Cook | 123/179 |
| 4,659,977 A | 4/1987 | Kissel et al. | 320/150 |
| 4,663,580 A | 5/1987 | Wortman | 320/153 |
| 4,665,370 A | 5/1987 | Holland | 324/429 |
| 4,667,143 A | 5/1987 | Cooper et al. | 320/153 |
| 4,667,279 A | 5/1987 | Maier | 363/46 |
| 4,678,998 A | 7/1987 | Muramatsu | 324/427 |
| 4,679,000 A | 7/1987 | Clark | 324/428 |
| 4,680,528 A | 7/1987 | Mikami et al. | 320/165 |
| 4,686,442 A | 8/1987 | Radomski | 320/123 |
| 4,697,134 A | 9/1987 | Burkum et al. | 320/134 |
| 4,707,795 A | 11/1987 | Alber et al. | 702/63 |
| 4,709,202 A | 11/1987 | Koenck et al. | 320/112 |
| 4,710,861 A | 12/1987 | Kanner | 363/46 |
| 4,719,428 A | 1/1988 | Liebermann | 324/436 |
| 4,723,656 A | 2/1988 | Kiernan et al. | 206/705 |
| 4,743,855 A | 5/1988 | Randin et al. | 324/430 |
| 4,745,349 A | 5/1988 | Palanisamy et al. | 320/125 |
| 4,773,011 A | 9/1988 | VanHoose | 701/30 |
| 4,781,629 A | 11/1988 | Mize | 439/822 |
| 4,816,768 A | 3/1989 | Champlin | 324/428 |
| 4,820,966 A | 4/1989 | Fridman | 320/116 |
| 4,825,170 A | 4/1989 | Champlin | 324/436 |
| 4,847,547 A | 7/1989 | Eng, Jr. et al. | 320/153 |
| 4,849,700 A | 7/1989 | Morioka et al. | 324/427 |
| 4,874,679 A | 10/1989 | Miyagawa | 429/91 |
| 4,876,495 A | 10/1989 | Palanisamy et al. | 320/106 |
| 4,881,038 A | 11/1989 | Champlin | 324/426 |
| 4,885,523 A | 12/1989 | Koenck | 230/131 |
| 4,888,716 A | 12/1989 | Ueno | 702/63 |
| 4,901,007 A | 2/1990 | Sworm | 324/110 |
| 4,907,176 A | 3/1990 | Bahnick et al. | 364/551.01 |
| 4,912,416 A | 3/1990 | Champlin | 324/430 |
| 4,913,116 A | 4/1990 | Katogi et al. | 123/406.32 |
| 4,926,330 A | 5/1990 | Abe et al. | 701/33 |
| 4,929,931 A | 5/1990 | McCuen | 340/636.15 |
| 4,931,738 A | 6/1990 | MacIntyre et al. | 324/435 |
| 4,932,905 A | 6/1990 | Richards | 439/822 |
| 4,933,845 A | 6/1990 | Hayes | 710/104 |
| 4,934,957 A | 6/1990 | Bellusci | 439/504 |
| 4,937,528 A | 6/1990 | Palanisamy | 324/430 |
| 4,947,124 A | 8/1990 | Hauser | 324/430 |
| 4,949,046 A | 8/1990 | Seyfang | 324/427 |
| 4,956,597 A | 9/1990 | Heavey et al. | 320/129 |
| 4,965,738 A | 10/1990 | Bauer et al. | 320/136 |
| 4,968,941 A | 11/1990 | Rogers | 324/428 |
| 4,968,942 A | 11/1990 | Palanisamy | 324/430 |
| 4,969,834 A | 11/1990 | Johnson | 439/141 |
| 4,983,086 A | 1/1991 | Hatrock | 411/259 |
| 5,004,979 A | 4/1991 | Marino et al. | 324/160 |
| 5,030,916 A | 7/1991 | Bokitch | 324/503 |
| 5,032,825 A | 7/1991 | Kuznicki | 340/636.15 |
| 5,034,893 A | 7/1991 | Fisher | 701/99 |
| 5,037,778 A | 8/1991 | Stark et al. | 228/121 |
| 5,047,722 A | 9/1991 | Wurst et al. | 324/430 |
| 5,081,565 A | 1/1992 | Nabha et al. | 362/465 |
| 5,087,881 A | 2/1992 | Peacock | 324/378 |
| 5,095,223 A | 3/1992 | Thomas | 307/110 |
| 5,108,320 A | 4/1992 | Kimber | 439/883 |
| 5,109,213 A | 4/1992 | Williams | 340/447 |
| 5,126,675 A | 6/1992 | Yang | 324/435 |
| 5,130,658 A | 7/1992 | Bohmer | 324/435 |
| 5,140,269 A | 8/1992 | Champlin | 324/433 |
| 5,144,218 A | 9/1992 | Bosscha | 320/139 |
| 5,144,248 A | 9/1992 | Alexandres et al. | 324/428 |
| 5,159,272 A | 10/1992 | Rao et al. | 324/429 |
| 5,160,881 A | 11/1992 | Schramm et al. | 322/7 |
| 5,168,208 A | 12/1992 | Schultz et al. | 322/25 |
| 5,170,124 A | 12/1992 | Blair et al. | 324/434 |
| 5,179,335 A | 1/1993 | Nor | 320/159 |
| 5,194,799 A | 3/1993 | Tomantschger | 320/103 |
| 5,204,611 A | 4/1993 | Nor et al. | 320/145 |
| 5,214,370 A | 5/1993 | Harm et al. | 320/152 |

| | | | | | | | |
|---|---|---|---|---|---|---|---|
| 5,214,385 A | 5/1993 | Gabriel et al. | 324/434 | 5,592,093 A | 1/1997 | Klingbiel | 324/426 |
| 5,241,275 A | 8/1993 | Fang | 324/430 | 5,592,094 A | 1/1997 | Ichikawa | 324/427 |
| 5,254,952 A | 10/1993 | Salley et al. | 324/429 | 5,596,260 A | 1/1997 | Moravec et al. | 320/135 |
| 5,266,880 A | 11/1993 | Newland | 320/125 | 5,598,098 A | 1/1997 | Champlin | 324/430 |
| 5,281,919 A | 1/1994 | Palanisamy | 324/427 | 5,602,462 A | 2/1997 | Stich et al. | 323/258 |
| 5,281,920 A | 1/1994 | Wurst | 324/430 | 5,606,242 A | 2/1997 | Hull et al. | 320/106 |
| 5,295,078 A | 3/1994 | Stich et al. | 700/297 | 5,614,788 A | 3/1997 | Mullins et al. | 315/82 |
| 5,298,797 A | 3/1994 | Redl | 327/387 | 5,621,298 A | 4/1997 | Harvey | 320/134 |
| 5,300,874 A | 4/1994 | Shimamoto et al. | 320/106 | 5,633,985 A | 5/1997 | Severson et al. | 704/267 |
| 5,302,902 A | 4/1994 | Groehl | 324/434 | 5,637,978 A | 6/1997 | Kellett et al. | 320/104 |
| 5,313,152 A | 5/1994 | Wozniak et al. | 320/118 | 5,642,031 A | 6/1997 | Brotto | 320/156 |
| 5,315,287 A | 5/1994 | Sol | 340/455 | 5,650,937 A | 7/1997 | Bounaga | 702/65 |
| 5,321,626 A | 6/1994 | Palladino | 702/63 | 5,652,501 A | 7/1997 | McClure et al. | 340/636.15 |
| 5,321,627 A | 6/1994 | Reher | 702/63 | 5,653,659 A | 8/1997 | Kunibe et al. | 477/111 |
| 5,323,337 A | 6/1994 | Wilson et al. | 702/73 | 5,654,623 A | 8/1997 | Shiga et al. | 320/106 |
| 5,325,041 A | 6/1994 | Briggs | 320/139 | 5,656,920 A | 8/1997 | Cherng et al. | 324/431 |
| 5,331,268 A | 7/1994 | Patino et al. | 320/158 | 5,661,368 A | 8/1997 | Deol et al. | 315/82 |
| 5,332,927 A | 7/1994 | Paul et al. | 307/66 | 5,675,234 A | 10/1997 | Greene | 340/636.11 |
| 5,336,993 A | 8/1994 | Thomas et al. | 324/158.1 | 5,677,077 A | 10/1997 | Faulk | 429/90 |
| 5,338,515 A | 8/1994 | Dalla Betta et al. | 422/95 | 5,684,678 A | 11/1997 | Barrett | 363/17 |
| 5,339,018 A | 8/1994 | Brokaw | 320/147 | 5,699,050 A | 12/1997 | Kanazawa | 340/636.13 |
| 5,343,380 A | 8/1994 | Champlin | 363/46 | 5,701,089 A | 12/1997 | Perkins | 324/772 |
| 5,347,163 A | 9/1994 | Yoshimura | 307/66 | 5,705,929 A | 1/1998 | Caravello et al. | 324/430 |
| 5,352,968 A | 10/1994 | Reni et al. | 320/136 | 5,707,015 A | 1/1998 | Guthrie | 241/120 |
| 5,357,519 A | 10/1994 | Martin et al. | 371/15.1 | 5,710,503 A | 1/1998 | Sideris et al. | 320/116 |
| 5,365,160 A | 11/1994 | Leppo et al. | 320/160 | 5,711,648 A | 1/1998 | Hammerslag | 414/800 |
| 5,365,453 A | 11/1994 | Startup et al. | 702/36 | 5,717,336 A | 2/1998 | Basell et al. | 324/430 |
| 5,369,364 A | 11/1994 | Renirie et al. | 324/430 | 5,717,937 A | 2/1998 | Fritz | 713/300 |
| 5,381,096 A | 1/1995 | Hirzel | 324/427 | 5,732,074 A | 3/1998 | Spaur et al. | 370/313 |
| 5,387,871 A | 2/1995 | Tsai | 324/429 | 5,739,667 A | 4/1998 | Matsuda et al. | 320/128 |
| 5,402,007 A | 3/1995 | Center et al. | 290/40 B | 5,744,962 A | 4/1998 | Alber et al. | 324/426 |
| 5,410,754 A | 4/1995 | Klotzbach et al. | 370/466 | 5,745,044 A | 4/1998 | Hyatt, Jr. et al. | 340/5.23 |
| 5,412,308 A | 5/1995 | Brown | 323/267 | 5,747,189 A | 5/1998 | Perkins | 429/91 |
| 5,412,323 A | 5/1995 | Kato et al. | 324/429 | 5,747,909 A | 5/1998 | Syverson et al. | 310/156.56 |
| 5,425,041 A | 6/1995 | Seko et al. | 372/45.01 | 5,747,967 A | 5/1998 | Muljadi et al. | 320/148 |
| 5,426,371 A | 6/1995 | Salley et al. | 324/429 | 5,754,417 A | 5/1998 | Nicollini | 363/60 |
| 5,426,416 A | 6/1995 | Jefferies et al. | 340/664 | 5,757,192 A | 5/1998 | McShane et al. | 324/427 |
| 5,430,645 A | 7/1995 | Keller | 364/424.01 | 5,760,587 A | 6/1998 | Harvey | 324/434 |
| 5,432,025 A | 7/1995 | Cox | 29/65 | 5,772,468 A | 6/1998 | Kowalski et al. | 439/506 |
| 5,432,426 A | 7/1995 | Yoshida | 320/160 | 5,773,978 A | 6/1998 | Becker | 324/430 |
| 5,434,495 A | 7/1995 | Toko | 320/135 | 5,778,326 A | 7/1998 | Moroto et al. | 701/22 |
| 5,435,185 A | 7/1995 | Eagan | 73/587 | 5,780,974 A | 7/1998 | Pabla et al. | 315/82 |
| 5,442,274 A | 8/1995 | Tamai | 320/146 | 5,780,980 A | 7/1998 | Naito | 318/139 |
| 5,445,026 A | 8/1995 | Eagan | 73/591 | 5,789,899 A | 8/1998 | van Phuoc et al. | 320/112 |
| 5,449,996 A | 9/1995 | Matsumoto et al. | 320/148 | 5,793,359 A | 8/1998 | Ushikubo | 345/169 |
| 5,449,997 A | 9/1995 | Gilmore et al. | 320/148 | 5,796,239 A | 8/1998 | van Phuoc et al. | 320/107 |
| 5,451,881 A | 9/1995 | Finger | 324/433 | 5,808,469 A | 9/1998 | Kopera | 324/434 |
| 5,453,027 A | 9/1995 | Buell et al. | 439/433 | 5,811,979 A | 9/1998 | Rhein | 324/718 |
| 5,457,377 A | 10/1995 | Jonsson | 324/430 | 5,818,234 A | 10/1998 | McKinnon | 324/433 |
| 5,459,660 A | 10/1995 | Berra | 701/33 | 5,820,407 A | 10/1998 | Morse et al. | 439/504 |
| 5,469,043 A | 11/1995 | Cherng et al. | 320/161 | 5,821,756 A | 10/1998 | McShane et al. | 324/430 |
| 5,485,090 A | 1/1996 | Stephens | 324/433 | 5,821,757 A | 10/1998 | Alvarez et al. | 324/434 |
| 5,488,300 A | 1/1996 | Jamieson | 324/432 | 5,825,174 A | 10/1998 | Parker | 324/106 |
| 5,504,674 A | 4/1996 | Chen et al. | 705/4 | 5,831,435 A | 11/1998 | Troy | 324/426 |
| 5,508,599 A | 4/1996 | Koenck | 320/138 | 5,832,396 A | 11/1998 | Moroto et al. | 701/22 |
| 5,519,383 A | 5/1996 | De La Rosa | 340/636.15 | 5,850,113 A | 12/1998 | Weimer et al. | 307/125 |
| 5,528,148 A | 6/1996 | Rogers | 320/137 | 5,862,515 A | 1/1999 | Kobayashi et al. | 702/63 |
| 5,537,967 A | 7/1996 | Tashiro et al. | 123/192.1 | 5,865,638 A | 2/1999 | Trafton | 439/288 |
| 5,541,489 A | 7/1996 | Dunstan | 320/134 | 5,871,858 A | 2/1999 | Thomsen et al. | 429/7 |
| 5,546,317 A | 8/1996 | Andrieu | 702/63 | 5,872,443 A | 2/1999 | Williamson | 320/160 |
| 5,548,273 A | 8/1996 | Nicol et al. | 340/439 | 5,872,453 A | 2/1999 | Shimoyama et al. | 324/431 |
| 5,550,485 A | 8/1996 | Falk | 324/772 | 5,883,306 A | 3/1999 | Hwang | 73/146.8 |
| 5,561,380 A | 10/1996 | Sway-Tin et al. | 324/509 | 5,895,440 A | 4/1999 | Proctor et al. | 702/63 |
| 5,562,501 A | 10/1996 | Kinoshita et al. | 439/852 | 5,903,154 A | 5/1999 | Zhang et al. | 324/437 |
| 5,563,496 A | 10/1996 | McClure | 320/128 | 5,903,716 A | 5/1999 | Kimber et al. | 395/114 |
| 5,572,136 A | 11/1996 | Champlin | 324/426 | 5,912,534 A | 6/1999 | Benedict | 315/82 |
| 5,573,611 A | 11/1996 | Koch et al. | 152/152.1 | 5,914,605 A | 6/1999 | Bertness | 324/430 |
| 5,574,355 A | 11/1996 | McShane et al. | 320/161 | 5,927,938 A | 7/1999 | Hammerslag | 414/809 |
| 5,578,915 A | 11/1996 | Crouch, Jr. et al. | 324/428 | 5,929,609 A | 7/1999 | Joy et al. | 322/25 |
| 5,583,416 A | 12/1996 | Klang | 320/160 | 5,939,855 A | 8/1999 | Proctor et al. | 320/104 |
| 5,585,416 A | 12/1996 | Audett et al. | 522/35 | 5,939,861 A | 8/1999 | Joko et al. | 320/122 |
| 5,585,728 A | 12/1996 | Champlin | 324/427 | 5,945,829 A | 8/1999 | Bertness | 324/430 |
| 5,589,757 A | 12/1996 | Klang | 320/160 | 5,946,605 A | 8/1999 | Takahisa et al. | 455/68 |

| | | | |
|---|---|---|---|
| 5,950,144 A | 9/1999 | Hall et al. ............... 702/108 |
| 5,951,229 A | 9/1999 | Hammerslag ............ 414/398 |
| 5,955,951 A | 9/1999 | Wischerop et al. ....... 340/572.8 |
| 5,961,561 A | 10/1999 | Wakefield, II ............. 701/29 |
| 5,961,604 A | 10/1999 | Anderson et al. .......... 709/229 |
| 5,969,625 A | 10/1999 | Russo ................. 340/636.19 |
| 5,973,598 A | 10/1999 | Beigel ................... 340/572.1 |
| 5,978,805 A | 11/1999 | Carson ..................... 707/10 |
| 5,982,138 A | 11/1999 | Krieger ................... 320/105 |
| 6,002,238 A | 12/1999 | Champlin ................. 320/134 |
| 6,005,489 A | 12/1999 | Siegle et al. .......... 340/825.69 |
| 6,005,759 A | 12/1999 | Hart et al. ................... 361/66 |
| 6,008,652 A | 12/1999 | Theofanopoulos et al. .. 324/434 |
| 6,009,369 A | 12/1999 | Boisvert et al. ............... 701/99 |
| 6,016,047 A | 1/2000 | Notten et al. ............... 320/137 |
| 6,031,354 A | 2/2000 | Wiley et al. ................. 320/116 |
| 6,031,368 A | 2/2000 | Klippel et al. .............. 324/133 |
| 6,037,745 A | 3/2000 | Koike et al. ............... 320/104 |
| 6,037,749 A | 3/2000 | Parsonage .................. 320/132 |
| 6,037,751 A | 3/2000 | Klang ...................... 320/160 |
| 6,037,777 A | 3/2000 | Champlin .................. 324/430 |
| 6,037,778 A | 3/2000 | Makhija .................... 324/433 |
| 6,046,514 A | 4/2000 | Rouillard et al. .............. 307/77 |
| 6,051,976 A | 4/2000 | Bertness .................... 324/426 |
| 6,055,468 A | 4/2000 | Kaman et al. ................. 701/29 |
| 6,061,638 A | 5/2000 | Joyce ......................... 702/63 |
| 6,064,372 A | 5/2000 | Kahkoska .................. 345/173 |
| 6,072,299 A | 6/2000 | Kurle et al. ................. 320/112 |
| 6,072,300 A | 6/2000 | Tsuji ......................... 320/116 |
| 6,081,098 A | 6/2000 | Bertness et al. ............. 320/134 |
| 6,081,109 A | 6/2000 | Seymour et al. ............ 324/127 |
| 6,087,815 A | 7/2000 | Pfeifer et al. ............... 323/282 |
| 6,091,238 A | 7/2000 | McDermott ............... 324/207.2 |
| 6,091,245 A | 7/2000 | Bertness .................... 324/426 |
| 6,094,033 A | 7/2000 | Ding et al. ................. 320/132 |
| 6,100,670 A | 8/2000 | Levesque ................... 320/150 |
| 6,104,167 A | 8/2000 | Bertness et al. ............. 320/106 |
| 6,113,262 A | 9/2000 | Purola et al. .................. 374/45 |
| 6,114,834 A | 9/2000 | Parise ........................ 320/109 |
| 6,137,269 A | 10/2000 | Champlin .................. 320/150 |
| 6,140,797 A | 10/2000 | Dunn ........................ 320/105 |
| 6,144,185 A | 11/2000 | Dougherty et al. .......... 320/132 |
| 6,147,598 A | 11/2000 | Murphy et al. .......... 340/426.19 |
| 6,150,793 A | 11/2000 | Lesesky et al. ............. 320/104 |
| 6,158,000 A | 12/2000 | Collins .......................... 713/1 |
| 6,161,640 A | 12/2000 | Yamaguchi ................ 180/65.8 |
| 6,163,156 A | 12/2000 | Bertness .................... 324/426 |
| 6,164,063 A | 12/2000 | Mendler ....................... 60/274 |
| 6,167,349 A | 12/2000 | Alvarez ....................... 702/63 |
| 6,172,483 B1 | 1/2001 | Champlin .................. 320/134 |
| 6,172,505 B1 | 1/2001 | Bertness .................... 324/430 |
| 6,177,737 B1 | 1/2001 | Palfey et al. .................. 307/64 |
| 6,181,545 B1 | 1/2001 | Amatucci et al. ............ 361/502 |
| 6,211,651 B1 | 4/2001 | Nemoto ..................... 320/133 |
| 6,215,275 B1 | 4/2001 | Bean ......................... 320/106 |
| 6,218,936 B1 | 4/2001 | Imao ......................... 340/447 |
| 6,222,342 B1 | 4/2001 | Eggert et al. ................ 320/105 |
| 6,222,369 B1 | 4/2001 | Champlin .................. 324/430 |
| D442,503 S | 5/2001 | Lundbeck et al. ............. D10/77 |
| 6,225,808 B1 | 5/2001 | Varghese et al. ............. 324/426 |
| 6,236,332 B1 | 5/2001 | Conkright et al. .............. 340/3.1 |
| 6,238,253 B1 | 5/2001 | Qualls ........................ 439/759 |
| 6,242,887 B1 | 6/2001 | Burke ........................ 320/104 |
| 6,249,124 B1 | 6/2001 | Bertness .................... 324/426 |
| 6,250,973 B1 | 6/2001 | Lowery et al. .............. 439/763 |
| 6,254,438 B1 | 7/2001 | Gaunt ........................ 439/755 |
| 6,259,170 B1 | 7/2001 | Limoge et al. ............. 307/10.8 |
| 6,259,254 B1 | 7/2001 | Klang ....................... 324/427 |
| 6,262,563 B1 | 7/2001 | Champlin .................. 320/134 |
| 6,263,268 B1 | 7/2001 | Nathanson .................... 701/29 |
| 6,271,643 B1 | 8/2001 | Becker et al. ............... 320/112 |
| 6,271,748 B1 | 8/2001 | Derbyshire et al. .......... 340/442 |
| 6,275,008 B1 | 8/2001 | Arai et al. ................... 320/132 |
| 6,294,896 B1 | 9/2001 | Champlin .................. 320/134 |
| 6,294,897 B1 | 9/2001 | Champlin .................. 320/153 |
| 6,304,087 B1 | 10/2001 | Bertness .................... 324/426 |
| 6,307,349 B1 | 10/2001 | Koenck et al. .............. 320/112 |
| 6,310,481 B2 | 10/2001 | Bertness .................... 324/430 |
| 6,313,607 B1 | 11/2001 | Champlin .................. 320/132 |
| 6,313,608 B1 | 11/2001 | Varghese et al. ............. 320/132 |
| 6,316,914 B1 | 11/2001 | Bertness .................... 320/134 |
| 6,320,351 B1 | 11/2001 | Ng et al. .................... 320/104 |
| 6,323,650 B1 | 11/2001 | Bertness et al. ............. 324/426 |
| 6,329,793 B1 | 12/2001 | Bertness et al. ............. 320/132 |
| 6,331,762 B1 | 12/2001 | Bertness .................... 320/134 |
| 6,332,113 B1 | 12/2001 | Bertness ...................... 702/63 |
| 6,346,795 B2 | 2/2002 | Haraguchi et al. ........... 320/136 |
| 6,347,958 B1 | 2/2002 | Tsai .......................... 439/488 |
| 6,351,102 B1 | 2/2002 | Troy ......................... 320/139 |
| 6,356,042 B1 | 3/2002 | Kahlon et al. ............... 318/138 |
| 6,359,441 B1 | 3/2002 | Bertness .................... 324/426 |
| 6,359,442 B1 | 3/2002 | Henningson et al. ........ 324/426 |
| 6,363,303 B1 | 3/2002 | Bertness ...................... 701/29 |
| RE37,677 E | 4/2002 | Irie ............................. 315/83 |
| 6,377,031 B1 | 4/2002 | Karuppana et al. .......... 323/220 |
| 6,384,608 B1 | 5/2002 | Namaky .................... 324/430 |
| 6,388,448 B1 | 5/2002 | Cervas ...................... 324/426 |
| 6,392,414 B2 | 5/2002 | Bertness .................... 324/429 |
| 6,396,278 B1 | 5/2002 | Makhija .................... 324/402 |
| 6,407,554 B1 | 6/2002 | Godau et al. ................ 324/503 |
| 6,411,098 B1 | 6/2002 | Laletin ...................... 324/436 |
| 6,417,669 B1 | 7/2002 | Champlin .................. 324/426 |
| 6,420,852 B1 | 7/2002 | Sato .......................... 320/134 |
| 6,424,157 B1 | 7/2002 | Gollomp et al. ............. 324/430 |
| 6,424,158 B2 | 7/2002 | Klang ....................... 324/433 |
| 6,437,957 B1 | 8/2002 | Karuppana et al. ............ 361/78 |
| 6,441,585 B1 | 8/2002 | Bertness .................... 320/132 |
| 6,445,158 B1 | 9/2002 | Bertness et al. ............. 320/104 |
| 6,449,726 B1 | 9/2002 | Smith ........................ 713/340 |
| 6,456,036 B1 * | 9/2002 | Thandiwe .................. 320/106 |
| 6,456,045 B1 | 9/2002 | Troy et al. .................. 320/139 |
| 6,465,908 B1 | 10/2002 | Karuppana et al. ............ 307/31 |
| 6,466,025 B1 | 10/2002 | Klang ....................... 324/429 |
| 6,466,026 B1 | 10/2002 | Champlin .................. 324/430 |
| 6,469,511 B1 | 10/2002 | Vonderhaar et al. ......... 324/425 |
| 6,477,478 B1 | 11/2002 | Jones et al. ................. 702/102 |
| 6,495,990 B2 | 12/2002 | Champlin .................. 320/132 |
| 6,497,209 B1 | 12/2002 | Karuppana et al. ........ 123/179.3 |
| 6,500,025 B1 | 12/2002 | Moenkhaus et al. ......... 439/502 |
| 6,505,507 B1 | 1/2003 | Imao ........................ 73/146.5 |
| 6,507,196 B2 | 1/2003 | Thomsen et al. ............. 324/436 |
| 6,526,361 B1 | 2/2003 | Jones et al. ................... 702/63 |
| 6,529,723 B1 | 3/2003 | Bentley ...................... 455/405 |
| 6,531,848 B1 | 3/2003 | Chitsazan et al. ............ 320/153 |
| 6,532,425 B1 | 3/2003 | Boost et al. ................... 702/63 |
| 6,534,992 B2 | 3/2003 | Meissner et al. ............ 324/426 |
| 6,534,993 B2 | 3/2003 | Bertness .................... 324/433 |
| 6,536,536 B1 | 3/2003 | Gass et al. ..................... 173/2 |
| 6,544,078 B2 | 4/2003 | Palmisano et al. ........... 439/762 |
| 6,545,599 B2 | 4/2003 | Derbyshire et al. .......... 340/442 |
| 6,556,019 B2 | 4/2003 | Bertness .................... 324/426 |
| 6,566,883 B1 | 5/2003 | Vonderhaar et al. ......... 324/426 |
| 6,570,385 B1 | 5/2003 | Roberts et al. .............. 324/378 |
| 6,577,107 B2 | 6/2003 | Kechmire .................. 320/139 |
| 6,586,941 B2 | 7/2003 | Bertness et al. ............. 324/426 |
| 6,597,150 B1 | 7/2003 | Bertness et al. ............. 320/104 |
| 6,599,243 B2 | 7/2003 | Woltermann et al. ........ 600/300 |
| 6,600,815 B1 | 7/2003 | Walding .................. 379/93.07 |
| 6,611,740 B2 | 8/2003 | Lowrey et al. ................ 701/29 |
| 6,614,349 B1 | 9/2003 | Proctor et al. .............. 340/572.1 |
| 6,618,644 B2 | 9/2003 | Bean ......................... 700/231 |
| 6,621,272 B2 | 9/2003 | Champlin .................. 324/426 |
| 6,623,314 B1 | 9/2003 | Cox et al. ................... 439/759 |
| 6,624,635 B1 | 9/2003 | Lui ........................... 324/426 |
| 6,628,011 B2 | 9/2003 | Droppo et al. ................ 307/43 |
| 6,629,054 B2 | 9/2003 | Makhija et al. ............. 702/113 |

| | | | |
|---|---|---|---|
| 6,633,165 B2 | 10/2003 | Bertness | 324/426 |
| 6,635,974 B1 | 10/2003 | Karuppana et al. | 307/140 |
| 6,667,624 B1 | 12/2003 | Raichle et al. | 324/522 |
| 6,679,212 B2 | 1/2004 | Kelling | 123/179.28 |
| 6,686,542 B2 | 2/2004 | Zhang | 174/74 |
| 6,696,819 B2 | 2/2004 | Bertness | 320/134 |
| 6,707,303 B2 | 3/2004 | Bertness et al. | 324/426 |
| 6,736,941 B2 | 5/2004 | Oku et al. | 203/68 |
| 6,737,831 B2 | 5/2004 | Champlin | 320/132 |
| 6,738,697 B2 | 5/2004 | Breed | 701/29 |
| 6,740,990 B2 | 5/2004 | Tozuka et al. | 307/9.1 |
| 6,745,153 B2 | 6/2004 | White et al. | 702/184 |
| 7,744,149 | 6/2004 | Karuppana et al. | 307/31 |
| 6,759,849 B2 | 7/2004 | Bertness et al. | 324/426 |
| 6,777,945 B2 | 8/2004 | Roberts et al. | 324/426 |
| 6,781,382 B2 | 8/2004 | Johnson | 324/426 |
| 6,784,635 B2 | 8/2004 | Larson | 320/104 |
| 6,784,637 B2 | 8/2004 | Raichle et al. | 320/107 |
| 6,788,025 B2 | 9/2004 | Bertness et al. | 320/104 |
| 6,795,782 B2 | 9/2004 | Bertness et al. | 702/63 |
| 6,796,841 B1 | 9/2004 | Cheng et al. | 439/620.3 |
| 6,805,090 B2 | 10/2004 | Bertness et al. | 123/198 |
| 6,806,716 B2 | 10/2004 | Bertness et al. | 324/426 |
| 6,825,669 B2 | 11/2004 | Raichle et al. | 324/426 |
| 6,842,707 B2 | 1/2005 | Raichle et al. | 702/62 |
| 6,845,279 B1 | 1/2005 | Gilmore et al. | 700/115 |
| 6,850,037 B2 | 2/2005 | Bertness | 320/132 |
| 6,871,151 B2 | 3/2005 | Bertness | 702/63 |
| 6,885,195 B2 | 4/2005 | Bertness | 324/426 |
| 6,888,468 B2 | 5/2005 | Bertness | 340/636.15 |
| 6,891,378 B2 | 5/2005 | Bertness et al. | 324/426 |
| 6,904,796 B2 | 6/2005 | Pacsai et al. | 73/146.8 |
| 6,906,522 B2 | 6/2005 | Bertness et al. | 324/426 |
| 6,906,523 B2 | 6/2005 | Bertness et al. | 324/426 |
| 6,906,624 B2 | 6/2005 | McClelland et al. | 340/442 |
| 6,909,287 B2 | 6/2005 | Bertness | 324/427 |
| 6,909,356 B2 | 6/2005 | Brown et al. | 340/3.2 |
| 6,913,483 B2 | 7/2005 | Restaino et al. | 439/504 |
| 6,914,413 B2 | 7/2005 | Bertness et al. | 320/104 |
| 6,919,725 B2 | 7/2005 | Bertness et al. | 324/433 |
| 6,930,485 B2 | 8/2005 | Bertness et al. | 324/426 |
| 6,933,727 B2 | 8/2005 | Bertness et al. | 324/426 |
| 6,941,234 B2 | 9/2005 | Bertness et al. | 702/63 |
| 6,967,484 B2 | 11/2005 | Bertness | 324/426 |
| 6,972,662 B1 | 12/2005 | Ohkawa et al. | 340/10.1 |
| 6,998,847 B2 | 2/2006 | Bertness et al. | 324/426 |
| 7,003,410 B2 | 2/2006 | Bertness et al. | 702/63 |
| 7,003,411 B2 | 2/2006 | Bertness | 702/63 |
| 7,012,433 B2 | 3/2006 | Smith et al. | 324/426 |
| 7,058,525 B2 | 6/2006 | Bertness et al. | 702/63 |
| 7,081,755 B2 | 7/2006 | Klang et al. | 324/426 |
| 7,106,070 B2 | 9/2006 | Bertness et al. | 324/538 |
| 7,116,109 B2 | 10/2006 | Klang | 324/426 |
| 7,119,686 B2 | 10/2006 | Bertness et al. | 340/572.1 |
| 7,120,488 B2 | 10/2006 | Nova et al. | 600/2 |
| 7,126,341 B2 | 10/2006 | Bertness et al. | 324/426 |
| 7,129,706 B2 * | 10/2006 | Kalley | 324/426 |
| 7,182,147 B2 | 2/2007 | Cutler et al. | 173/1 |
| 7,184,905 B2 | 2/2007 | Stefan | 702/63 |
| 7,200,424 B2 | 4/2007 | Tischer et al. | 455/567 |
| 7,209,860 B2 | 4/2007 | Trsar et al. | 702/183 |
| 7,212,887 B2 | 5/2007 | Shah et al | 700/276 |
| 7,235,977 B2 * | 6/2007 | Koran et al. | 324/426 |
| 7,272,519 B2 | 9/2007 | Lesesky et al. | 702/63 |
| 7,339,477 B2 | 3/2008 | Puzio et al. | 340/572.1 |
| 7,446,536 B2 | 11/2008 | Bertness | 324/426 |
| 2002/0004694 A1 | 1/2002 | McLeod | 701/29 |
| 2002/0010558 A1 | 1/2002 | Bertness et al. | 702/63 |
| 2002/0041175 A1 | 4/2002 | Lauper et al. | 320/106 |
| 2002/0044050 A1 | 4/2002 | Derbyshire et al. | 340/442 |
| 2002/0171428 A1 | 11/2002 | Bertness | 702/63 |
| 2002/0176010 A1 | 11/2002 | Wallach et al. | 348/362 |
| 2003/0009270 A1 | 1/2003 | Breed | 701/29 |
| 2003/0025481 A1 | 2/2003 | Bertness | 324/427 |
| 2003/0036909 A1 | 2/2003 | Kato | 704/275 |
| 2003/0040873 A1 | 2/2003 | Lesesky et al. | 702/57 |
| 2003/0088375 A1 | 5/2003 | Bertness et al. | 702/63 |
| 2003/0137277 A1 | 7/2003 | Mori et al. | 320/132 |
| 2003/0169018 A1 | 9/2003 | Berels et al. | 320/132 |
| 2003/0184262 A1 | 10/2003 | Makhija | 320/156 |
| 2003/0184306 A1 | 10/2003 | Bertness et al. | 324/426 |
| 2003/0187556 A1 | 10/2003 | Suzuki | 701/29 |
| 2003/0194672 A1 | 10/2003 | Roberts et al. | 431/196 |
| 2003/0214395 A1 | 11/2003 | Flowerday et al. | 340/445 |
| 2004/0000590 A1 | 1/2004 | Raichle et al. | 235/462.01 |
| 2004/0000891 A1 | 1/2004 | Raichle et al. | 320/107 |
| 2004/0000893 A1 | 1/2004 | Raichle et al. | 320/135 |
| 2004/0002824 A1 | 1/2004 | Raichle et al. | 702/63 |
| 2004/0002825 A1 | 1/2004 | Raichle et al. | 702/63 |
| 2004/0002836 A1 | 1/2004 | Raichle et al. | 702/188 |
| 2004/0032264 A1 | 2/2004 | Schoch | 324/426 |
| 2004/0044452 A1 | 3/2004 | Bauer et al. | 703/33 |
| 2004/0049361 A1 | 3/2004 | Hamdan et al. | 702/115 |
| 2004/0051533 A1 | 3/2004 | Namaky | 324/426 |
| 2004/0054503 A1 | 3/2004 | Namaky | 702/182 |
| 2004/0113588 A1 | 6/2004 | Mikuriya et al. | 320/128 |
| 2004/0145342 A1 | 7/2004 | Lyon | 320/108 |
| 2004/0178185 A1 | 9/2004 | Yoshikawa et al. | 219/270 |
| 2004/0199343 A1 | 10/2004 | Cardinal et al. | 702/63 |
| 2004/0227523 A1 | 11/2004 | Namaky | 324/537 |
| 2004/0239332 A1 | 12/2004 | Mackel et al. | 324/426 |
| 2005/0017726 A1 | 1/2005 | Koran et al. | 324/433 |
| 2005/0025299 A1 | 2/2005 | Tischer et al. | 379/199 |
| 2005/0043868 A1 | 2/2005 | Mitcham | 701/29 |
| 2005/0057256 A1 | 3/2005 | Bertness | 324/426 |
| 2005/0102073 A1 | 5/2005 | Ingram | 701/29 |
| 2005/0182536 A1 | 8/2005 | Doyle et al. | 701/29 |
| 2005/0254106 A9 | 11/2005 | Silverbrook et al. | 358/539 |
| 2005/0256617 A1 | 11/2005 | Cawthorne et al. | 701/22 |
| 2006/0030980 A1 | 2/2006 | St. Denis | 701/29 |
| 2006/0089767 A1 | 4/2006 | Sowa | 701/29 |
| 2006/0217914 A1 | 9/2006 | Bertness | 702/113 |
| 2006/0282323 A1 | 12/2006 | Walker et al. | 705/14 |
| 2007/0026916 A1 | 2/2007 | Juds et al. | 463/1 |

FOREIGN PATENT DOCUMENTS

| | | |
|---|---|---|
| DE | 196 38 324 | 9/1996 |
| EP | 0 022 450 A1 | 1/1981 |
| EP | 0 637 754 A1 | 2/1995 |
| EP | 0 772 056 A1 | 5/1997 |
| EP | 0 982 159 A2 | 3/2000 |
| FR | 2 749 397 | 12/1997 |
| GB | 2 029 586 | 3/1980 |
| GB | 2 088 159 A | 6/1982 |
| GB | 2 246 916 A | 10/1990 |
| GB | 2 275 783 A | 7/1994 |
| GB | 2 387 235 A | 10/2003 |
| JP | 59-17892 | 1/1984 |
| JP | 59-17893 | 1/1984 |
| JP | 59-17894 | 1/1984 |
| JP | 59017894 | 1/1984 |
| JP | 59215674 | 12/1984 |
| JP | 60225078 | 11/1985 |
| JP | 62-180284 | 8/1987 |
| JP | 63027776 | 2/1988 |
| JP | 03274479 | 12/1991 |
| JP | 03282276 | 12/1991 |
| JP | 4-8636 | 1/1992 |
| JP | 04095788 | 3/1992 |
| JP | 04131779 | 5/1992 |
| JP | 04372536 | 12/1992 |
| JP | 5-211724 | 8/1993 |
| JP | 5216550 | 8/1993 |
| JP | 7-128414 | 5/1995 |
| JP | 09061505 | 3/1997 |

| | | |
|---|---|---|
| JP | 10056744 | 2/1998 |
| JP | 10232273 | 9/1998 |
| JP | 11103503 A | 4/1999 |
| RU | 2089015 C1 | 8/1997 |
| WO | WO 93/22666 | 11/1993 |
| WO | WO 94/05069 | 3/1994 |
| WO | 96/01456 | 1/1996 |
| WO | 96/06747 | 3/1996 |
| WO | 97/01103 | 1/1997 |
| WO | WO 97/44652 | 11/1997 |
| WO | WO 98/04910 | 2/1998 |
| WO | WO 98/58270 | 12/1998 |
| WO | WO 99/23738 | 5/1999 |
| WO | WO 00/16083 | 3/2000 |
| WO | WO 00/62049 | 10/2000 |
| WO | WO 00/67359 | 11/2000 |
| WO | WO 01/59443 | 2/2001 |
| WO | WO 01/16614 | 3/2001 |
| WO | WO 01/16615 | 3/2001 |
| WO | WO 01/51947 | 7/2001 |
| WO | WO 03/047064 | 6/2003 |
| WO | WO 03/076960 | 9/2003 |
| WO | WO 2004/047215 | 6/2004 |

OTHER PUBLICATIONS

"Battery Impedance", by E. Willihnganz et al., *Electrical Engineering*, Sep. 1959, pp. 922-925.
"Determining The End of Battery Life", by S. DeBardelaben, *IEEE*, 1986, pp. 365-368.
"A Look at the Impedance of a Cell", by S. Debardelaben, *IEEE*, 1988, pp. 394-397.
"The Impedance of Electrical Storage Cells", by N.A. Hampson et al., *Journal of Applied Electrochemistry*, 1980, pp. 3-11.
"A Package for Impedance/Admittance Data Analysis", by B. Boukamp, *Solid State Ionics*, 1986, pp. 136-140.
"Precision of Impedance Spectroscopy Estimates of Bulk, Reaction Rate, and Diffusion Parameters", by J. Macdonald et al., *J. Electroanal, Chem.*, 1991, pp. 1-11.
Internal Resistance: Harbinger of Capacity Loss in Starved Electrolyte Sealed Lead Acid Batteries, by Vaccaro, F.J. et al., *AT&T Bell Laboratories*, 1987 IEEE, Ch. 2477, pp. 128,131.
IEEE Recommended Practice For Maintenance, Testings, and Replacement of Large Lead Storage Batteries for Generating Stations and Substations, *The Institute of Electrical and Electronics Engineers, Inc., ANSI/IEEE Std.* 450-1987, Mar. 9, 1987, pp. 7-15.
"Field and Laboratory Studies to Assess the State of Health of Valve-Regulated Lead Acid Batteries: Part I Conductance/Capacity Correlation Studies", by D. Feder et al., *IEEE*, Aug. 1992, pp. 218-233.
"Battery Impedance", by E. Willihnganz et al., *Electrical Engineering*, Sep. 1959, pp. 922-925.
"JIS Japanese Industrial Standard-Lead Acid Batteries for Automobiles", *Japanese Standards Association UDC*, 621.355.2:629.113. 006, Nov. 1995.
"Performance of Dry Cells", by C. Hambuechen, Preprint of *Am. Electrochem. Soc.*, Apr. 18-20, 1912, paper No. 19, pp. 1-5.
"A Bridge for Measuring Storage Battery Resistance", by E. Willihncanz, *The Electrochemical Society*, preprint 79-20, Apr. 1941, pp. 253-258.
National Semiconductor Corporation, "High Q Notch Filter", Linear Brief 5, Mar. 1969.
Burr-Brown Corporation, "Design A 60 Hz Notch Filter with the UAF42", Jan. 1994, AB-071, 1994.
National Semiconductor Corporation, "LMF90-4$^{th}$-Order Elliptic Notch Filter", RRD-B30M115, Dec. 1994.
"Alligator Clips with Wire Penetrators" J.S. Popper, Inc. product information, downloaded from http://www.jspopper.com/, undated.
"#12: LM78S40 Simple Switcher DC to DC Converter", *ITM e-Catalog*, downloaded from http://www.pcbcafe.com, undated.
"Simple DC-DC Converts Allows Use of Single Battery", *Electronix Express*, downloaded from http://www.elexp.com/t_dc-dc.htm, undated.
"DC-DC Converter Basics", *Power Designers*, downloaded from http://www.powederdesigners.com/InforWeb.design_center/articles/DC-DC/converter.shtm, undated.
"Notification of Transmittal of The International Search Report or the Declaration", PCT/US02/29461.
"Notification of Transmittal of The International Search Report or the Declaration", PCT/US03/07546.
"Notification of Transmittal of The International Search Report or the Declaration", PCT/US03/06577.
"Notification of Transmittal of The International Search Report or the Declaration", PCT/US03/07837.
"Improved Impedance Spectroscopy Technique For Status Determination of Production Li/SO$_2$ Batteries" Terrill Atwater et al., pp. 10-113, (1992).
"Notification of Transmittal of The International Search Report or the Declaration", PCT/US03/41561.
"Notification of Transmittal of The International Search Report or the Declaration", PCT/US03/27696.
"Programming Training Course, 62-000 Series Smart Engine Analyzer", Testproducts Division, Kalamazoo, Michigan, pp. 1-207, (1984).
"Operators Manual, Modular Computer Analyzer Model MCA 3000", Sun Electric Corporation, Crystal Lake, Illinois, pp. 1-1-14-13, (1991).
Supplementary European Search Report Communication for Appl. No. 99917402.2.
"Dynamic modelling of lead/acid batteries using impedance spectroscopy for parameter identification", Journal of Power Sources, pp. 69-84, (1997).
Notification of Transmittal of the International Search Report for, PCT/US03/30707.
"A review of impedance measurements for determination of the state-of-charge or state-of-health of secondary batteries", Journal of Power Sources, pp. 59-69, (1998).
"Search Report Under Section 17" for Great Britain Application No. GB0421447.4.
"Results of Discrete Frequency Immittance Spectroscopy (DFIS) Measurements of Lead Acid Batteries", by K.S. Champlin et al., *Proceedings of 23$^{rd}$ International Teleco Conference (INTELEC)*, published Oct. 2001, IEE, pp. 433-440.
"Examination Report" from the U.K. Patent Office for U.K. App. No. 0417678.0.
Wikipedia Online Encyclopedia, Inductance, 2005, http://en.wikipedia.org/wiki/inductance, pp. 1-5, mutual Inductance, pp. 3,4.
Young Illustrated Encyclopedia Dictionary of Electronics, 1981, Parker Publishing Company, Inc., pp. 318-319.
"DSP Applications in Hybrid Electric Vehicle Powertrain", Miller et al., Proceedings of the American Control Conference, Sand Diego, CA, Jun. 1999; 2 ppg.
"Notification of Transmittal of the International Search Report and the Written Opinion of the International Searching Authority, or the Declaration" for PCT/US2008/008702 filed Jul. 2008; 15 pages.
"Notification Concerning Availability of the Publication of the International Application" for PCT/US2008/008702, filed Jul. 17, 2008; 24 pages.
"A Microprocessor-Based Control System for a Near-Term Electric Vehicle", Bimal K. Bose; IEEE Transactions on Industry Applications, vol. IA-17, No. 6, Nov./Dec. 198?,; 0093-9994/81/1100-0626$00.75 © 1981 IEEE, 6 pages.
"First Notice Informing the Applicant of the Communication of the International Application (To Designated Offices which do not apply the 30 Month Time Limit Under Article 22(1))" for PCT/US2008/008702 filed Jul. 17, 2008; one page.
"Notification of the Recording of a Change" for PCT/US2008/008702 filed Jul. 17, 2008; one page.
Office Action from U.S. Appl. No. 11/146,608; dated May 13, 2008.
Office Action from U.S. Appl. No. 11/063,247; dated Apr. 11, 2008.

* cited by examiner

WIRELESS BATTERY TESTER WITH INFORMATION ENCRYPTION MEANS

The present application is based on and claims the benefit of U.S. provisional patent application Ser. No. 60/587,232, filed Jul. 12, 2004, the content of which is hereby incorporated by reference in its entirety.

CROSS REFERENCE TO RELATED APPLICATION

Reference is made to co-pending and commonly assigned U.S. patent application Ser. No. 11/018,785, filed Dec. 21, 2004, entitled "WIRELESS BATTERY MONITOR," the content of which is hereby incorporated by reference in its entirety.

BACKGROUND OF THE INVENTION

The present invention relates to battery testers/chargers of the type used to test/charge individual storage batteries. In particular, the present invention relates to a wireless battery tester/charger.

Battery testers test storage batteries to determine various conditions of a battery. For example, battery testers can be useful to determine the amount of charge a storage battery can hold (i.e. capacity of the battery) or the state of health of a storage battery.

Storage batteries are used in various applications including remote cellular stations, electrical switching stations, hospitals, and many other installations requiring a source of backup power. Another example of an application for storage batteries are automotive vehicles, both electrical vehicles and vehicles with internal combustion engines.

A number of battery testing techniques are known in the art. These techniques include measuring the specific gravity of acid contained in a storage battery. Measuring a battery voltage and performing a load test on a battery in which a large load is placed on the battery and the response observed. More recently, a technique has been pioneered by Dr. Keith S. Champlin and Midtronics, Inc. of Willowbrook, Ill. for testing storage batteries by measuring the conductance of the batteries. This technique is described in a number of United State patents, for example, U.S. Pat. No. 3,873,911, issued Mar. 25, 1975, to Champlin, entitled ELECTRONIC BATTERY TESTING DEVICE; U.S. Pat. No. 3,909,708, issued Sep. 30, 1975, to Champlin, entitled ELECTRONIC BATTERY TESTING DEVICE; U.S. Pat. No. 4,816,768, issued Mar. 28, 1989, to Champlin, entitled ELECTRONIC BATTERY TESTING DEVICE; U.S. Pat. No. 4,825,170, issued Apr. 25, 1989, to Champlin, entitled ELECTRONIC BATTERY TESTING DEVICE WITH AUTOMATIC VOLTAGE SCALING; U.S. Pat. No. 4,881,038, issued Nov. 14, 1989, to Champlin, entitled ELECTRONIC BATTERY TESTING DEVICE WITH AUTOMATIC VOLTAGE SCALING TO DETERMINE DYNAMIC CONDUCTANCE; U.S. Pat. No. 4,912,416, issued Mar. 27, 1990, to Champlin, entitled ELECTRONIC BATTERY TESTING DEVICE WITH STATE-OF-CHARGE COMPENSATION; U.S. Pat. No. 5,140,269, issued Aug. 18, 1992, to Champlin, entitled ELECTRONIC TESTER FOR ASSESSING BATTERY/CELL CAPACITY; U.S. Pat. No. 5,343,380, issued Aug. 30, 1994, entitled METHOD AND APPARATUS FOR SUPPRESSING TIME-VARYING SIGNALS IN BATTERIES UNDERGOING CHARGING OR DISCHARGING; U.S. Pat. No. 5,572,136, issued Nov. 5, 1996, entitled ELECTRONIC BATTERY TESTER DEVICE; U.S. Pat. No. 5,574,355, issued Nov. 12, 1996, entitled METHOD AND APPARATUS FOR DETECTION AND CONTROL OF THERMAL RUNAWAY IN A BATTERY UNDER CHARGE; U.S. Pat. No. 5,585,416, issued Dec. 10, 1996, entitled APPARATUS AND METHOD FOR STEP-CHARGING BATTERIES TO OPTIMIZE CHARGE ACCEPTANCE; U.S. Pat. No. 5,585,728, issued Dec. 17, 1996, entitled ELECTRONIC BATTERY TESTER WITH AUTOMATIC COMPENSATION FOR LOW STATE-OF-CHARGE; U.S. Pat. No. 5,589,757, issued Dec. 31, 1996, entitled APPARATUS AND METHOD FOR STEP-CHARGING BATTERIES TO OPTIMIZE CHARGE ACCEPTANCE; U.S. Pat. No. 5,592,093, issued Jan. 7, 1997, entitled ELECTRONIC BATTERY TESTING DEVICE LOOSE TERMINAL CONNECTION DETECTION VIA A COMPARISON CIRCUIT; U.S. Pat. No. 5,598,098, issued Jan. 28, 1997, entitled ELECTRONIC BATTERY TESTER WITH VERY HIGH NOISE IMMUNITY; U.S. Pat. No. 5,656,920, issued Aug. 12, 1997, entitled METHOD FOR OPTIMIZING THE CHARGING LEAD-ACID BATTERIES AND AN INTERACTIVE CHARGER; U.S. Pat. No. 5,757,192, issued May 26, 1998, entitled METHOD AND APPARATUS FOR DETECTING A BAD CELL IN A STORAGE BATTERY; U.S. Pat. No. 5,821,756, issued Oct. 13, 1998, entitled ELECTRONIC BATTERY TESTER WITH TAILORED COMPENSATION FOR LOW STATE-OF CHARGE; U.S. Pat. No. 5,831,435, issued Nov. 3, 1998, entitled BATTERY TESTER FOR JIS STANDARD; U.S. Pat. No. 5,871,858, issued Feb. 16, 1999, entitled ANTI-THEFT BATTERY; U.S. Pat. No. 5,914,605, issued Jun. 22, 1999, entitled ELECTRONIC BATTERY TESTER; U.S. Pat. No. 5,945,829, issued Aug. 31, 1999, entitled MIDPOINT BATTERY MONITORING; U.S. Pat. No. 6,002,238, issued Dec. 14, 1999, entitled METHOD AND APPARATUS FOR MEASURING COMPLEX IMPEDANCE OF CELLS AND BATTERIES; U.S. Pat. No. 6,037,751, issued Mar. 14, 2000, entitled APPARATUS FOR CHARGING BATTERIES; U.S. Pat. No. 6,037,777, issued Mar. 14, 2000, entitled METHOD AND APPARATUS FOR DETERMINING BATTERY PROPERTIES FROM COMPLEX IMPEDANCE/ADMITTANCE; U.S. Pat. No. 6,051,976, issued Apr. 18, 2000, entitled METHOD AND APPARATUS FOR AUDITING A BATTERY TEST; U.S. Pat. No. 6,081,098, issued Jun. 27, 2000, entitled METHOD AND APPARATUS FOR CHARGING A BATTERY; U.S. Pat. No. 6,091,245, issued Jul. 18, 2000, entitled METHOD AND APPARATUS FOR AUDITING A BATTERY TEST; U.S. Pat. No. 6,104,167, issued Aug. 15, 2000, entitled METHOD AND APPARATUS FOR CHARGING A BATTERY; U.S. Pat. No. 6,137,269, issued Oct. 24, 2000, entitled METHOD AND APPARATUS FOR ELECTRONICALLY EVALUATING THE INTERNAL TEMPERATURE OF AN ELECTROCHEMICAL CELL OR BATTERY; U.S. Pat. No. 6,163,156, issued Dec. 19, 2000, entitled ELECTRICAL CONNECTION FOR ELECTRONIC BATTERY TESTER; U.S. Pat. No. 6,172,483, issued Jan. 9, 2001, entitled METHOD AND APPARATUS FOR MEASURING COMPLEX IMPEDANCE OF CELLS AND BATTERIES; U.S. Pat. No. 6,172,505, issued Jan. 9, 2001, entitled ELECTRONIC BATTERY TESTER; U.S. Pat. No. 6,222,369, issued Apr. 24, 2001, entitled METHOD AND APPARATUS FOR DETERMINING BATTERY PROPERTIES FROM COMPLEX IMPEDANCE/ADMITTANCE; U.S. Pat. No. 6,225,808, issued May 1, 2001, entitled TEST COUNTER FOR ELECTRONIC BATTERY TESTER; U.S. Pat. No. 6,249,124, issued Jun. 19, 2001, entitled ELECTRONIC BATTERY TESTER WITH INTERNAL BATTERY; U.S. Pat. No. 6,259,254, issued Jul. 10, 2001, entitled APPARATUS AND METHOD FOR CARRYING OUT DIAGNOSTIC TESTS ON BATTERIES AND FOR RAPIDLY CHARGING BATTERIES; U.S. Pat. No. 6,262,563, issued Jul. 17, 2001, entitled METHOD AND APPARATUS FOR MEASURING COMPLEX ADMITTANCE OF CELLS AND BATTERIES; U.S. Pat. No. 6,294,896, issued Sep. 25, 2001; entitled METHOD AND APPARATUS FOR MEASURING COMPLEX SELF-IMMITANCE OF A GENERAL ELECTRICAL ELEMENT; U.S. Pat. No. 6,294,897, issued Sep. 25, 2001, entitled METHOD AND APPARATUS FOR ELECTRONICALLY EVALUATING THE INTERNAL TEMPERATURE OF AN ELECTROCHEMICAL CELL OR BATTERY; U.S. Pat. No. 6,304,087, issued Oct. 16, 2001, entitled APPARATUS FOR CALIBRATING ELECTRONIC BATTERY TESTER; U.S. Pat. No. 6,310,481, issued Oct. 30, 2001, entitled ELECTRONIC BATTERY TESTER; U.S. Pat. No. 6,313,607, issued Nov. 6, 2001, entitled METHOD AND APPARATUS FOR EVALUATING STORED CHARGE IN AN ELECTROCHEMICAL CELL OR BATTERY; U.S. Pat. No. 6,313,608, issued Nov. 6, 2001, entitled METHOD AND APPARATUS FOR CHARGING A BATTERY; U.S. Pat. No. 6,316,914, issued Nov. 13, 2001, entitled TESTING PARALLEL STRINGS OF STORAGE BATTERIES; U.S. Pat. No. 6,323,650, issued Nov. 27, 2001, entitled ELECTRONIC BATTERY TESTER; U.S. Pat. No. 6,329,793, issued Dec. 11, 2001, entitled METHOD AND APPARATUS FOR CHARGING A BATTERY; U.S. Pat. No. 6,331,762, issued Dec. 18, 2001, entitled ENERGY MANAGEMENT SYSTEM FOR AUTOMOTIVE VEHICLE; U.S. Pat. No. 6,332,113, issued Dec. 18, 2001, entitled ELECTRONIC BATTERY TESTER; U.S. Pat. No. 6,351,102, issued Feb. 26, 2002, entitled AUTOMOTIVE BATTERY CHARGING SYSTEM TESTER; U.S. Pat. No. 6,359,441, issued Mar. 19, 2002, entitled ELECTRONIC BATTERY TESTER; U.S. Pat. No. 6,363,303, issued Mar. 26, 2002, entitled ALTERNATOR DIAGNOSTIC SYSTEM; U.S. Pat. No. 6,377,031, issued Apr. 23, 2002, entitled INTELLIGENT SWITCH FOR POWER MANAGEMENT; U.S. Pat. No. 6,392,414, issued May 21, 2002, entitled ELECTRONIC BATTERY TESTER; U.S. Pat. No. 6,417,669, issued Jul. 9, 2002, entitled SUPPRESSING INTERFERENCE IN AC MEASUREMENTS OF CELLS, BATTERIES AND OTHER ELECTRICAL ELEMENTS; U.S. Pat. No. 6,424,158, issued Jul. 23, 2002, entitled APPARATUS AND METHOD FOR CARRYING OUT DIAGNOSTIC TESTS ON BATTERIES AND FOR RAPIDLY CHARGING BATTERIES; U.S. Pat. No. 6,441,585, issued Aug. 17, 2002, entitled APPARATUS AND METHOD FOR TESTING RECHARGEABLE ENERGY STORAGE BATTERIES; U.S. Pat. No. 6,437,957, issued Aug. 20, 2002, entitled SYSTEM AND METHOD FOR PROVIDING SURGE, SHORT, AND REVERSE POLARITY CONNECTION PROTECTION; U.S. Pat. No. 6,445,158, issued Sep. 3, 2002, entitled VEHICLE ELECTRICAL SYSTEM TESTER WITH ENCODED OUTPUT; U.S. Pat. No. 6,456,045, issued Sep. 24, 2002, entitled INTEGRATED CONDUCTANCE AND LOAD TEST BASED ELECTRONIC BATTERY TESTER; U.S. Pat. No. 6,466,025, issued Oct. 15, 2002, entitled ALTERNATOR TESTER; U.S. Pat. No. 6,465,908, issued Oct. 15, 2002, entitled INTELLIGENT POWER MANAGEMENT SYSTEM; U.S. Pat. No. 6,466,026, issued Oct. 15, 2002, entitled PROGRAMMABLE CURRENT EXCITER FOR MEASURING AC IMMITTANCE OF CELLS AND BATTERIES; U.S. Pat. No. 6,469,511, issued Nov. 22, 2002, entitled BATTERY CLAMP WITH EMBEDDED ENVIRONMENT SENSOR; U.S. Pat. No. 6,495,990, issued Dec. 17, 2002, entitled METHOD AND APPARATUS FOR EVALUATING STORED CHARGE IN AN ELECTROCHEMICAL CELL OR BATTERY; U.S. Pat. No. 6,497,209, issued Dec. 24, 2002, entitled SYSTEM AND METHOD FOR PROTECTING A CRANKING SUBSYSTEM; U.S. Pat. No. 6,507,196, issued Jan. 14, 2003; entitled BATTERY HAVING DISCHARGE STATE INDICATION; U.S. Pat. No. 6,534,993, issued Mar. 18, 2003, entitled ELECTRONIC BATTERY TESTER; U.S. Pat. No. 6,544,078, issued Apr. 8, 2003, entitled BATTERY CLAMP WITH INTEGRATED CURRENT SENSOR; U.S. Pat. No. 6,556,019, issued Apr. 29, 2003, entitled ELECTRONIC BATTERY TESTER; U.S. Pat. No. 6,566,883, issued May 20, 2003, entitled ELECTRONIC BATTERY TESTER; U.S. Pat. No. 6,586,941, issued Jul. 1, 2003, entitled BATTERY TESTER WITH DATABUS; U.S. Pat. No. 6,597,150, issued Jul. 22, 2003, entitled METHOD OF DISTRIBUTING JUMP-START BOOSTER PACKS; U.S. Pat. No. 6,621,272, issued Sep. 16, 2003, entitled PROGRAMMABLE CURRENT EXCITER FOR MEASURING AC IMMITTANCE OF CELLS AND BATTERIES; U.S. Pat. No. 6,623,314, issued Sep. 23, 2003, entitled KELVIN CLAMP FOR ELECTRICALLY COUPLING TO A BATTERY CONTACT; U.S. Pat. No. 6,633,165, issued Oct. 14, 2003, entitled IN-VEHICLE BATTERY MONITOR; U.S. Pat. No. 6,635,974, issued Oct. 21, 2003, entitled SELF-LEARNING POWER MANAGEMENT SYSTEM AND METHOD; U.S. Pat. No. 6,707,303, issued Mar. 16, 2004, entitled ELECTRONIC BATTERY TESTER; U.S. Pat. No. 6,737,831, issued May 18, 2004, entitled METHOD AND APPARATUS USING A CIRCUIT MODEL TO EVALUATE CELL/BATTERY PARAMETERS; U.S. Pat. No. 6,744,149, issued Jun. 1, 2004, entitled SYSTEM AND METHOD FOR PROVIDING STEP-DOWN POWER CONVERSION USING AN INTELLIGENT SWITCH; U.S. Pat. No. 6,759,849, issued Jul. 6, 2004, entitled BATTERY TESTER CONFIGURED TO RECEIVE A REMOVABLE DIGITAL MODULE; U.S. Pat. No. 6,781,382, issued Aug. 24, 2004, entitled ELECTRONIC BATTERY TESTER; U.S. Pat. No. 6,788,025, filed Sep. 7, 2004, entitled BATTERY CHARGER WITH BOOSTER PACK; U.S. Pat. No. 6,795,782, issued Sep. 21, 2004, entitled BATTERY TEST MODULE; U.S. Pat. No. 6,805,090, filed Oct. 19, 2004, entitled CHARGE CONTROL SYSTEM FOR A VEHICLE BATTERY; U.S. Pat. No. 6,806,716, filed Oct. 19, 2004, entitled ELECTRONIC BATTERY TESTER; U.S. Pat. No. 6,850,037, filed Feb. 1, 2005, entitled IN-VEHICLE BATTERY MONITORING; U.S. Ser. No. 09/780,146, filed Feb. 9, 2001, entitled STORAGE BATTERY WITH INTEGRAL BATTERY TESTER; U.S. Ser. No. 09/756,638, filed Jan. 8, 2001, entitled METHOD AND APPARATUS FOR DETERMINING BATTERY PROPERTIES FROM COMPLEX IMPEDANCE/ADMITTANCE; U.S. Ser. No. 09/862,783, filed May 21, 2001, entitled METHOD AND APPARATUS FOR TESTING CELLS AND BATTERIES EMBEDDED IN SERIES/PARALLEL SYSTEMS; U.S. Ser. No. 09/880,473, filed Jun. 13, 2001; entitled BATTERY TEST MODULE; U.S. Ser. No. 60/348,479, filed Oct. 29, 2001, entitled CONCEPT FOR TESTING HIGH POWER VRLA BATTERIES; U.S. Ser. No. 10/046,659, filed Oct. 29, 2001, entitled ENERGY MANAGEMENT SYSTEM FOR AUTOMOTIVE VEHICLE; U.S. Ser. No. 09/993,468, filed Nov. 14, 2001, entitled KELVIN CONNECTOR FOR A BATTERY POST; U.S. Ser. No. 10/042,451, filed Jan. 8, 2002, entitled BATTERY CHARGE CONTROL DEVICE; U.S. Ser. No. 10/093,853, filed Mar. 7, 2002, entitled ELECTRONIC BATTERY TESTER WITH NETWORK COMMUNICATION; U.S. Ser. No. 10/098,741, filed Mar. 14, 2002, entitled METHOD AND APPARATUS FOR AUDITING A BATTERY TEST; U.S. Ser. No. 10/112,114, filed Mar. 28, 2002, entitled BOOSTER PACK WITH STORAGE CAPACITOR; U.S. Ser. No. 10/109,734, filed Mar. 28, 2002, entitled APPARATUS AND METHOD FOR COUNTERACTING SELF DISCHARGE IN A STORAGE BATTERY; U.S. Ser. No. 10/112,998, filed Mar. 29, 2002, entitled BATTERY TESTER WITH BATTERY REPLACEMENT OUTPUT; U.S. Ser. No. 10/119,297, filed Apr. 9, 2002, entitled METHOD AND APPARATUS FOR TESTING CELLS AND BATTERIES EMBEDDED IN SERIES/PARALLEL SYSTEMS; U.S. Ser. No. 60/387,046, filed Jun. 7, 2002, entitled METHOD AND APPARATUS FOR INCREASING THE LIFE OF A STORAGE BATTERY; U.S. Ser. No. 10/200,041, filed Jul. 19, 2002, entitled AUTOMOTIVE VEHICLE ELECTRICAL SYSTEM DIAGNOSTIC DEVICE; U.S. Ser. No. 10/217,913, filed Aug. 13, 2002, entitled, BATTERY TEST MODULE; U.S. Ser. No. 10/246,439, filed Sep. 18, 2002, entitled BATTERY TESTER UPGRADE USING SOFTWARE KEY; U.S. Ser. No. 10/263,473, filed Oct. 2, 2002, entitled ELECTRONIC BATTERY TESTER WITH RELATIVE TEST OUTPUT; U.S. Ser. No. 10/310,385, filed Dec. 5, 2002, entitled BATTERY TEST MODULE; U.S. Ser. No. 60/437,224, filed Dec. 31, 2002, entitled DISCHARGE VOLTAGE PREDICTIONS; U.S. Ser. No. 10/349,053, filed Jan. 22, 2003, entitled APPARATUS AND METHOD FOR PROTECTING A BATTERY FROM OVERDISCHARGE; U.S. Ser. No. 10/388,855, filed Mar. 14, 2003, entitled ELECTRONIC BATTERY TESTER WITH BATTERY FAILURE TEMPERATURE DETERMINATION; U.S. Ser. No. 10/396,550, filed Mar. 25, 2003, entitled ELECTRONIC BATTERY TESTER; U.S. Ser. No. 60/467,872, filed May 5, 2003, entitled METHOD FOR DETERMINING BATTERY STATE OF CHARGE; U.S. Ser. No. 60/477,082, filed Jun. 9, 2003, entitled ALTERNATOR TESTER; U.S. Ser. No. 10/460,749, filed Jun. 12, 2003, entitled MODULAR BATTERY TESTER FOR SCAN TOOL; U.S. Ser. No. 10/462,323, filed Jun. 16, 2003, entitled ELECTRONIC BATTERY TESTER HAVING A USER INTERFACE TO CONFIGURE A PRINTER; U.S. Ser. No. 10/601,608, filed Jun. 23, 2003, entitled CABLE FOR ELECTRONIC BATTERY TESTER; U.S. Ser. No. 10/601,432, filed Jun. 23, 2003, entitled BATTERY TESTER CABLE WITH MEMORY; U.S. Ser. No. 60/490,153, filed Jul. 25, 2003, entitled SHUNT CONNECTION TO A PCB FOR AN ENERGY MANAGEMENT SYSTEM EMPLOYED IN AN AUTOMOTIVE VEHICLE; U.S. Ser. No. 10/653,342, filed Sep. 2, 2003, entitled ELECTRONIC BATTERY TESTER CONFIGURED TO PREDICT A LOAD TEST RESULT; U.S. Ser. No. 10/654,098, filed Sep. 3, 2003, entitled BATTERY TEST OUTPUTS ADJUSTED BASED UPON BATTERY TEMPERATURE AND THE STATE OF DISCHARGE OF THE BATTERY; U.S. Ser. No. 10/656,526, filed Sep. 5, 2003, entitled METHOD AND APPARATUS FOR MEASURING A PARAMETER OF A VEHICLE ELECTRICAL SYSTEM; U.S. Ser. No. 10/656,538, filed Sep. 5, 2003, entitled ALTERNATOR TESTER WITH ENCODED OUTPUT; U.S. Ser. No. 10/675,933, filed Sep. 30, 2003, entitled QUERY BASED ELECTRONIC BATTERY TESTER; U.S. Ser. No. 10/678,629, filed Oct. 3, 2003, entitled ELECTRONIC BATTERY TESTER/CHARGER WITH INTEGRATED BATTERY CELL TEMPERATURE MEASUREMENT DEVICE; U.S. Ser. No. 10/441,271, filed May 19, 2003, entitled ELECTRONIC BATTERY TESTER; U.S. Ser. No. 09/653,963, filed Sep. 1, 2000, entitled SYSTEM AND METHOD FOR CONTROLLING POWER GENERATION AND STORAGE; U.S. Ser. No. 10/174,110, filed Jun. 18, 2002, entitled DAYTIME RUNNING LIGHT CONTROL USING AN INTELLIGENT POWER MANAGEMENT SYSTEM; U.S. Ser. No. 60/488,775, filed Jul. 21, 2003, entitled ULTRASONICALLY ASSISTED CHARGING; U.S. Ser. No. 10/258,441, filed Apr. 9, 2003, entitled CURRENT MEASURING CIRCUIT SUITED FOR BATTERIES; U.S. Ser. No. 10/705,020, filed Nov. 11, 2003, entitled APPARATUS AND METHOD FOR SIMULATING A BATTERY TESTER WITH A FIXED RESISTANCE LOAD; U.S. Ser. No. 10/681,666, filed Oct. 8, 2003, entitled ELECTRONIC BATTERY TESTER WITH PROBE LIGHT; U.S. Ser. No. 10/748,792, filed Dec. 30, 2003, entitled APPARATUS AND METHOD FOR PREDICTING THE REMAINING DISCHARGE TIME OF A BATTERY; U.S. Ser. No. 10/783,682, filed Feb. 20, 2004, entitled REPLACEABLE CLAMP FOR ELECTRONIC BATTERY TESTER; U.S. Ser. No. 60/548,513, filed Feb. 27, 2004, entitled WIRELESS BATTERY MONITOR; U.S. Ser. No. 10/791,141, filed Mar. 2, 2004, entitled METHOD AND APPARATUS FOR AUDITING A BATTERY TEST; U.S. Ser. No. 60/557,366, filed Mar. 29, 2004, entitled BATTERY MONITORING SYSTEM WITHOUT CURRENT MEASUREMENT; U.S. Ser. No. 10/823,140, filed Apr. 13, 2004, entitled THEFT PREVENTION DEVICE FOR AUTOMOTIVE VEHICLE SERVICE CENTERS; U.S. Ser. No. 60/575,945, filed Jun. 1, 2004, entitled BATTERY TESTER CAPABLE OF IDENTIFYING FAULTY BATTERY POST ADAPTERS; U.S. Ser. No. 60/577,345, filed Jun. 4, 2004, entitled NEW METHOD FOR AUTOMATICALLY TESTING A BATTERY AND TRANSMITTING DATA TO ANOTHER MODULE IN A VEHICLE; U.S. Ser. No. 10/864,904, filed Jun. 9, 2004, entitled ALTERNATOR TESTER; U.S. Ser. No. 10/867,385, filed Jun. 14, 2004, entitled ENERGY MANAGEMENT SYSTEM FOR AUTOMOTIVE VEHICLE; U.S. Ser. No. 10/870,680, filed Jun. 17, 2004, entitled ELECTRONIC BATTERY TESTER WITH RELATIVE TEST OUTPUT; U.S. Ser. No. 60/582,925, filed Jun. 25, 2004, entitled BATTERY TESTER WITH BATTERY POTENTIAL FOR RECOVERY OUTPUT; U.S. Ser. No. 10/883,019, filed Jul. 1, 2004, entitled MODULAR ELECTRONIC BATTERY TESTER; U.S. Ser. No. 60/585,700, filed Jul. 6, 2004, entitled TEST STATION; U.S. Ser. No. 60/587,232, filed Jul. 12, 2004, entitled WIRELESS BATTERY TESTER; U.S. Ser. No. 10/896,835, filed Jul. 22, 2004, entitled BROADBAND LOW-INDUCTANCE CABLES FOR MAKING KELVIN CONNECTIONS TO ELECTROCHEMICAL CELLS AND BATTERIES; U.S. Ser. No. 10/896,834, filed Jul. 22, 2004, entitled ELECTRONIC BATTERY TESTER; U.S. Ser. No. 10/897,801, filed Jul. 23, 2004, entitled SHUNT CONNECTION TO A PCB FOR AN ENERGY MANAGEMENT SYSTEM EMPLOYED IN AN AUTOMOTIVE VEHICLE; U.S. Ser. No. 10/914,304, filed Aug. 9, 2004, entitled ELECTRONIC BATTERY TESTER WITH NETWORK COMMUNICATION; U.S. Ser. No. 60/603,078, filed Aug. 20, 2004, entitled SYSTEM FOR AUTOMATICALLY GATHERING BATTERY INFORMATION FOR USE DURING BATTERY TESTING/CHARGING; U.S. Ser. No. 10/958,821, filed Oct. 5, 2004, entitled IN-VEHICLE BATTERY MONITOR; U.S. Ser. No. 10/958,812, filed Oct. 5, 2004, entitled SCAN TOOL FOR ELECTRONIC BATTERY TESTER; U.S. Ser. No. 11/008,456, filed Dec. 9, 2004, entitled APPARATUS AND METHOD FOR PREDICTING BATTERY CAPACITY AND FITNESS FOR SERVICE FROM A BATTERY DYNAMIC PARAMETER AND A RECOVERY VOLTAGE DIFFERENTIAL, U.S. Ser. No. 60/587,232, filed Dec. 14, 2004, entitled CELLTRON ULTRA, U.S. Ser. No. 11/018,785, filed Dec. 21, 2004, entitled WIRELESS BATTERY MONITOR; U.S. Ser. No. 60/653,537, filed Feb. 16, 2005, entitled CUSTOMER MANAGED WARRANTY CODE; which are incorporated herein in their entirety.

Typically, especially in the automotive industry, technicians use battery testers to determine a condition of a storage battery. Generally, battery testers indicate results of the test on the actual device itself. This technique, however, can limit the mobility of the technician, the manipulation of generated data and storage of data. Current battery chargers also, in general, have similar limitations.

SUMMARY OF THE INVENTION

An electronic battery tester and method includes generating battery test data from an electronic battery test. The battery test data is transmitted over a wireless communication medium. In another aspect, a method and apparatus is provided for receiving battery test data from a wireless communication medium. Also, a diagnostic battery charger, which is capable of transmitting battery condition information to an external receiver, is provided.

BRIEF DESCRIPTION OF THE DRAWINGS

FIGS. 4-1 and 4-2 are simplified block diagrams of the receiving system (shown in FIGS. 2 and 3) coupled to the Internet and an Intranet, respectively.

DETAILED DESCRIPTION OF THE PREFERRED EMBODIMENTS

The present invention provides a technique for wirelessly transmitting battery test data. The present invention is for use with any battery tester or testing technique and those discussed herein are strictly examples. The present invention also provides a technique for combining the results of a battery test with information related to conditions of the battery test into a test code (audit code) for wireless transmission. As described herein, the present invention is useful in transmitting lengthy battery testing information and audit code information. Also, a diagnostic battery charger, which is capable of transmitting battery condition information to an external receiver, is provided.

Figure 1:
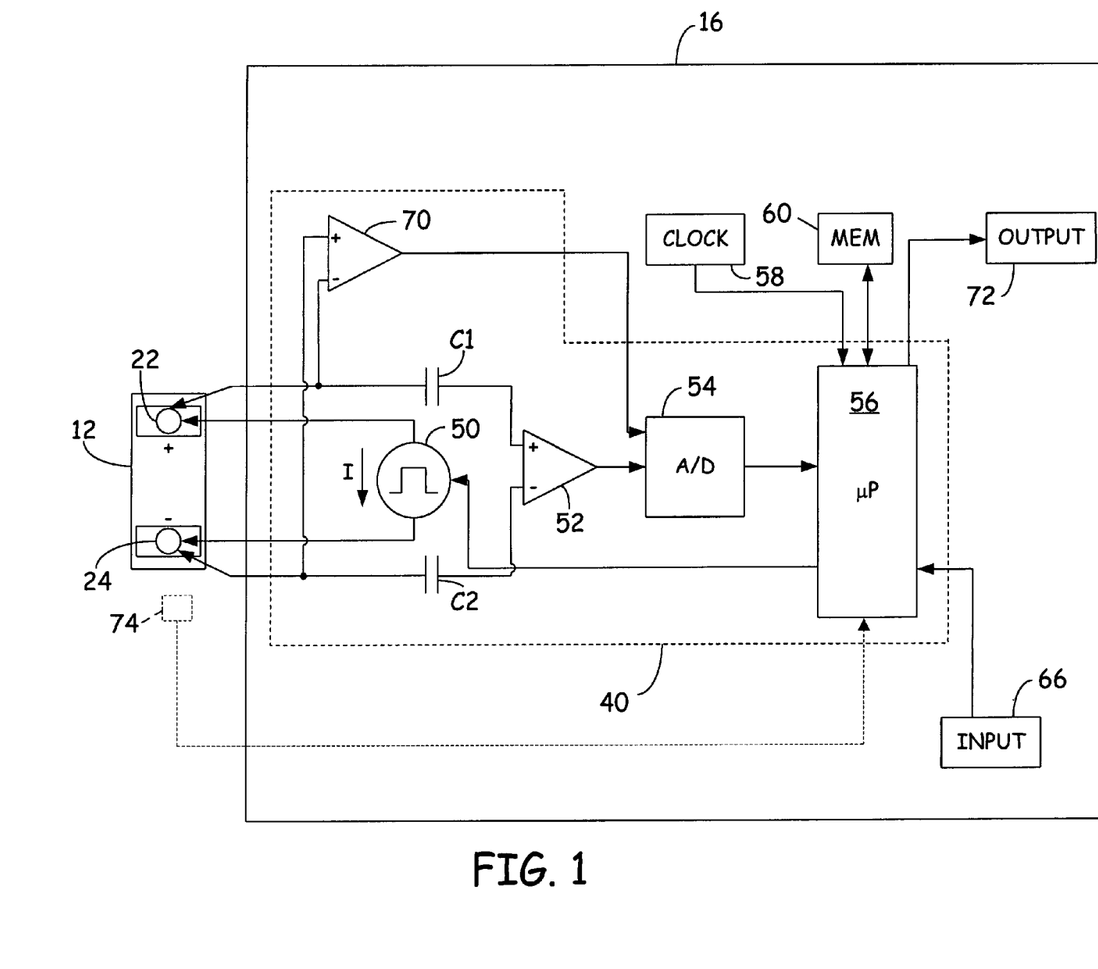
FIG. 1 is a simplified block diagram illustrating a battery tester in accordance with an embodiment of the present invention.

FIG. 1 is a simplified block diagram of an example battery tester 16 in accordance with an embodiment of the present invention. Apparatus 16 is shown coupled to battery 12 which includes a positive battery terminal 22 and a negative battery terminal 24.

Tester 16 operates in accordance with one embodiment of the present invention and determines the conductance ($G_{BAT}$) of battery 12 and the voltage potential ($V_{BAT}$) between terminals 22 and 24 of battery 12. Tester 16 includes testing circuitry 40. Testing circuitry 40 includes a current source 50, a differential amplifier 52, an analog-to-digital converter 54 and a microprocessor 56. Amplifier 52 is capacitively coupled to battery 12 through capacitors $C_1$ and $C_2$. Amplifier 52 has an output connected to an input of analog-to-digital converter 54. Microprocessor 56 is connected to system clock 58, memory 60, and analog-to-digital converter 54. Microprocessor 56 is also capable of receiving an input from input device 66 and outputting information to output device 72.

In operation, current source 50 is controlled by microprocessor 56 and provides a current I in the direction shown by the arrow in FIG. 1. In one embodiment, this is a square wave or a pulse. Differential amplifier 52 is connected to terminals 22 and 24 of battery 12 through capacitors $C_1$ and $C_2$, respectively, and provides an output related to the voltage potential difference between terminals 22 and 24. In a preferred embodiment, amplifier 52 has a high input impedance. Tester 16 includes differential amplifier 70 having inverting and noninverting inputs connected to terminals 24 and 22, respectively. Amplifier 70 is connected to measure the open circuit potential voltage ($V_{BAT}$) of battery 12 between terminals 22 and 24. The output of amplifier 70 is provided to analog-to-digital converter 54 such that the voltage across terminals 22 and 24 can be measured by microprocessor 56.

Tester 16 is connected to battery 12 through a four-point connection technique known as a Kelvin connection. This Kelvin connection allows current I to be injected into battery 12 through a first pair of terminals while the voltage V across the terminals 22 and 24 is measured by a second pair of connections. Because very little current flows through amplifier 52, the voltage drop across the inputs to amplifier 52 is substantially identical to the voltage drop across terminals 22 and 24 of battery 12. The output of differential amplifier 52 is converted to a digital format and is provided to microprocessor 56. Microprocessor 56 operates at a frequency determined by system clock 58 and in accordance with programming instructions stored in memory 60.

Microprocessor 56 determines the conductance of battery 12 by applying a current pulse I using current source 50. Microprocessor 56 determines the change in battery voltage due to the current pulse I using amplifier 52 and analog-to-digital converter 54. The value of current I generated by current source 50 is known and is stored in memory 60. In one embodiment, current I is obtained by applying a load to battery 12. Microprocessor 56 calculates the conductance of battery 12 using the following equation:

$$\text{Conductance} = G_{BAT} = \Delta I / \Delta V \qquad \text{Equation 1}$$

where $\Delta I$ is the change in current flowing through battery 12 due to current source 50 and $\Delta V$ is the change in battery voltage due to applied current $\Delta I$.

Based upon the battery conductance $G_{BAT}$ and the battery voltage, the battery tester 16 determines the condition of battery 12. For example, if the battery conductance $G_{BAT}$ is lower than a predetermined threshold for a particular battery at a particular voltage, microprocessor 56 determines that battery 12 has failed the battery test. For example, as explained in the Champlin patents, the tester can compare the measured CCA (Cold Cranking Amp) with the rated CCA for that particular battery. A temperature sensor 74 can be thermally coupled to battery 12 and used to compensate battery measurements. Temperature readings can be stored in memory 60 and transmitted, along with other test data, with the help of communication circuitry described below in connection with FIG. 2.

Figure 2:
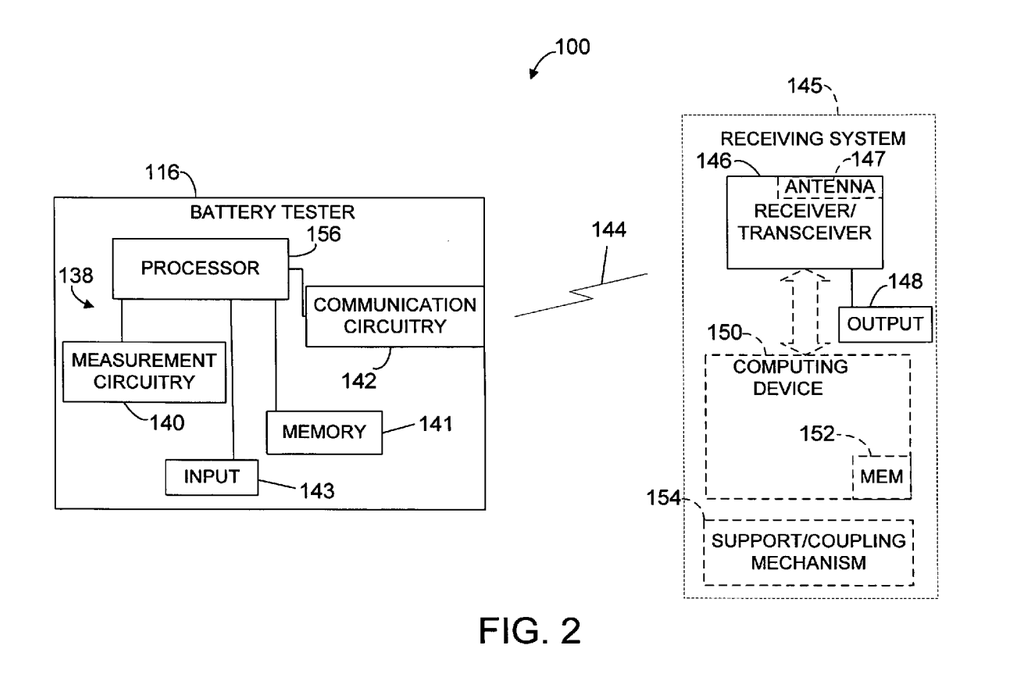
FIG. 2 is a simplified block diagram of a wireless battery testing system in accordance with an embodiment of the present invention.

FIG. 2 is a simplified block diagram of a wireless battery testing system 100 in accordance with an embodiment of the present invention. Wireless battery testing system 100 includes battery tester 116. Battery tester 116, for example, can be battery tester 16 illustrated in FIG. 1. However, battery tester 116 can be other types of battery testers that measure various parameters of a battery and determine battery condition. For example, battery tester 116 can be portable such that it can easily move between vehicles or otherwise be transported. Battery tester 116 includes measurement circuitry 140, memory 141 and input 143, which are coupled to a microprocessor 156. Microprocessor 156 is also operably coupled to communication circuitry 142, which can comprise a transmitter or a transceiver. Measurement circuitry 140 and microprocessor 156 together form battery test circuitry 138. Microprocessor 156 is configured to generate a battery test result (or, in general, battery test data) based on measurements made by circuitry 140. Microprocessor 156 is configured to provide the battery result to communication circuitry 142.

Communication circuitry 142 transmits battery test results over wireless communication link 144 to an external receiving system 145. Wireless communication link 144 can include a variety of types of signals. For example, communication link 144 can be a diffused infrared signal. Diffused infrared signals utilize the walls and ceiling of a room to bounce infrared signals between communication circuitry 142 and receiving system 145. Thus, people walking about a room as well as other obstructions will not interfere with sustained infrared communication. However, communication circuitry 142 and receiving system 145 must be located in the same room because infrared communication can not penetrate fixed obstructions, such as walls. In another example, communication link 144 can be a radio frequency (RF) signal. In this example, communication circuitry 142 and receiving system 145 can be located in different rooms because RF signals can easily penetrate walls and other obstructions.

External receiving system 145 can be implemented as desired. In some embodiments, receiving system 145 can comprise only a receiver/transceiver 146 (optionally including an antenna 147) and an output 148, which may be a display unit, for example. Components 146 and 148 may be integrated as a single unit or be separate units that are coupled together. In other embodiments, in addition to receiver/transceiver 146 and output 148, a computing device 150 can be connected to receiver/transceiver 146 such that it can receive the battery test results, display the results in different formats, and/or log and store results in memory 152. In such embodiments, the collected data can be used as desired. In one implementation, receiving system 145 can be configured to couple into, for example, the Internet or an Intranet to serve a web page, which contains the battery test results. This allows storage battery information to be viewable by using any web browser coupled to receiving system 145 through a data network. In another implementation, computing device 150 can be a point of sale system such that battery condition data can be available to the customer, stored in a customer account and managed by a technician. In other examples, receiving system 145 can be located in a bay of an automotive service center, located on a technician, located in an automotive vehicle, or located in a charger. To facilitate coupling/installation at the above-noted locations, receiving system 145 can include a support/coupling mechanism 154, which can be implemented as desired. For example, in a portable embodiment of device 145, support/coupling mechanism 154 can comprise a strap and/or clip that is designed to help a technician easily carry device 145. For location/integration in a charger, coupling/support mechanism can include suitable mechanical and electrical components that provide the necessary mechanical and electrical coupling.

Figure 3:
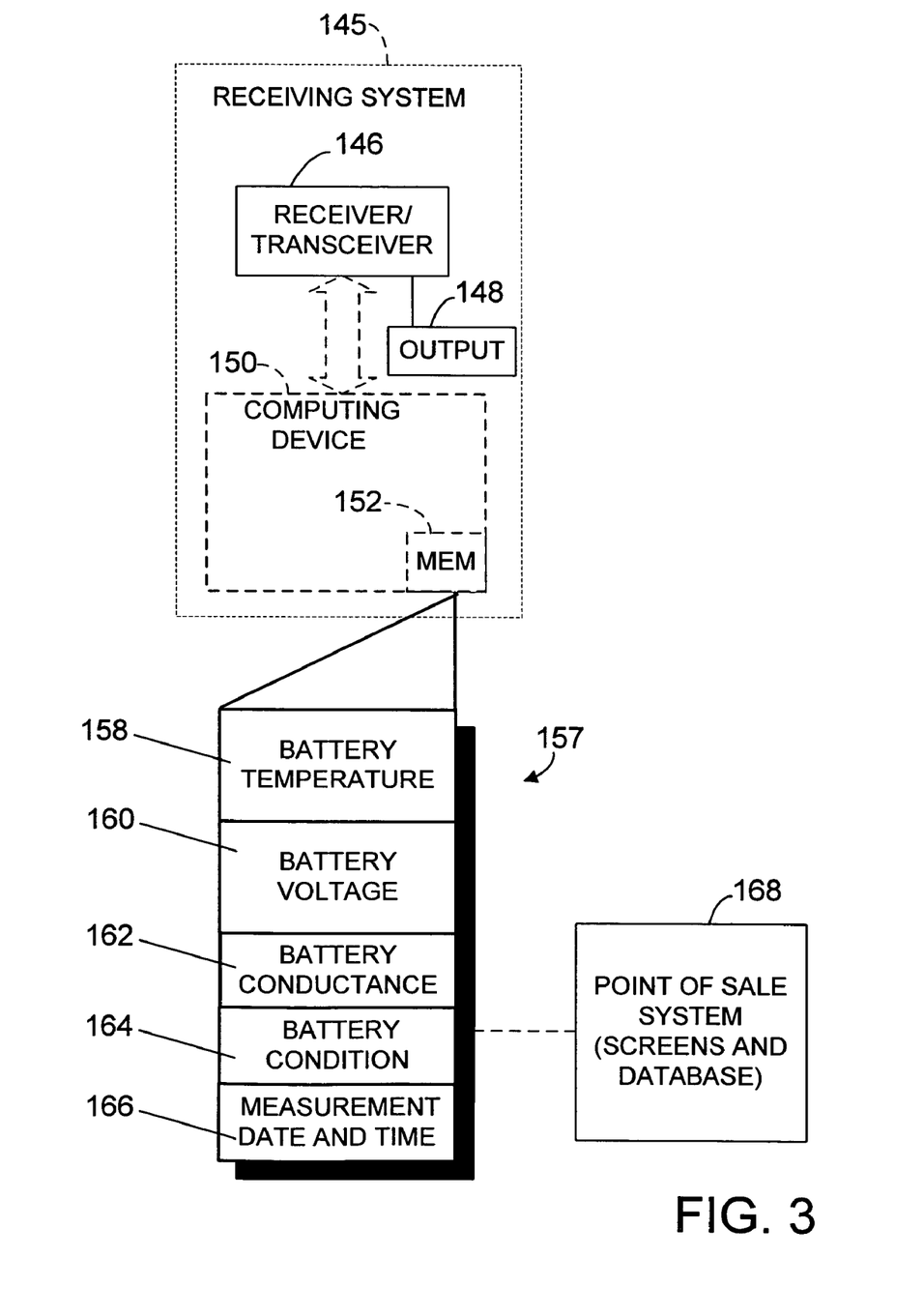
FIG. 3 is a simplified block diagram illustrating an example battery information database contained in the receiving system shown in FIG. 2.

As mentioned above, receiving system 145 can log and store battery test results in memory 152. FIG. 3 illustrates an example battery information database 157, which is stored in memory 152. When computing device 150 receives new battery information from receiver/transceiver 146, it executes program instructions, which may also be stored in memory 152 along with database 157, for updating database 157 with the newly received battery test data. Database 157 may be any type of hierarchical or relational database that is known in the industry or developed in the future. Similarly, the database update software may be any software that is suitable for updating the particular type of database 157. Database 157 can include one or more tables that, in turn, include several test data fields. As can be seen in FIG. 3, the test data fields can include a battery temperature field 158, a battery voltage filed 160, a battery conductance field 162, a battery condition field 164 and a measurement date and time filed 166. Database 157 can also include an additional table that stores battery maintenance and replacement information. Each maintenance/replacement record in the database can include a username, or other identification means, for the user that carried out the battery maintenance/replacement. In some embodiments, the username of a currently logged-in user is included in the database record each time an update is carried out. As mentioned above, information in memory 152 can be part of a point of sale system (denoted by reference numeral 168 in FIG. 3), that has multiple tables and screens for storing and displaying customer information.

Figure 41:
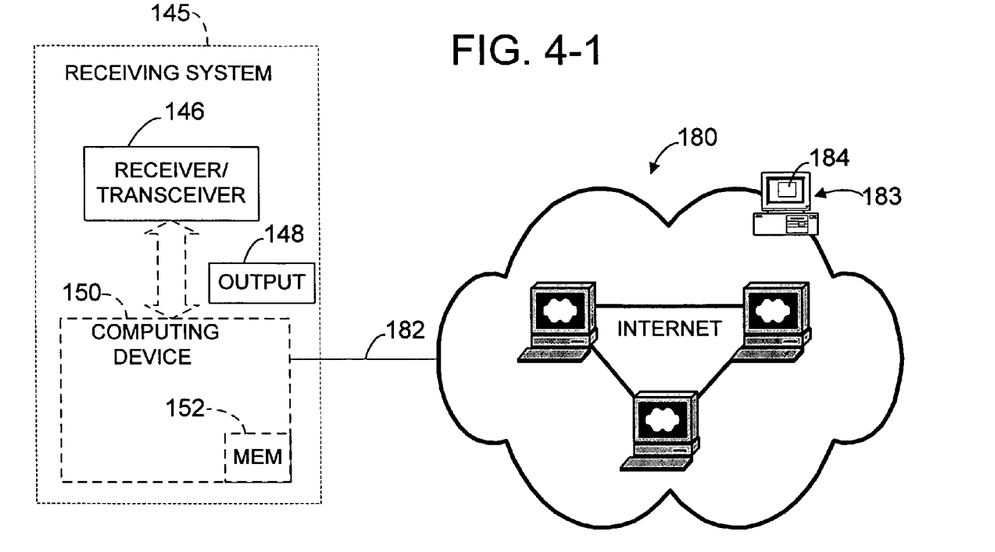
Figure 42:
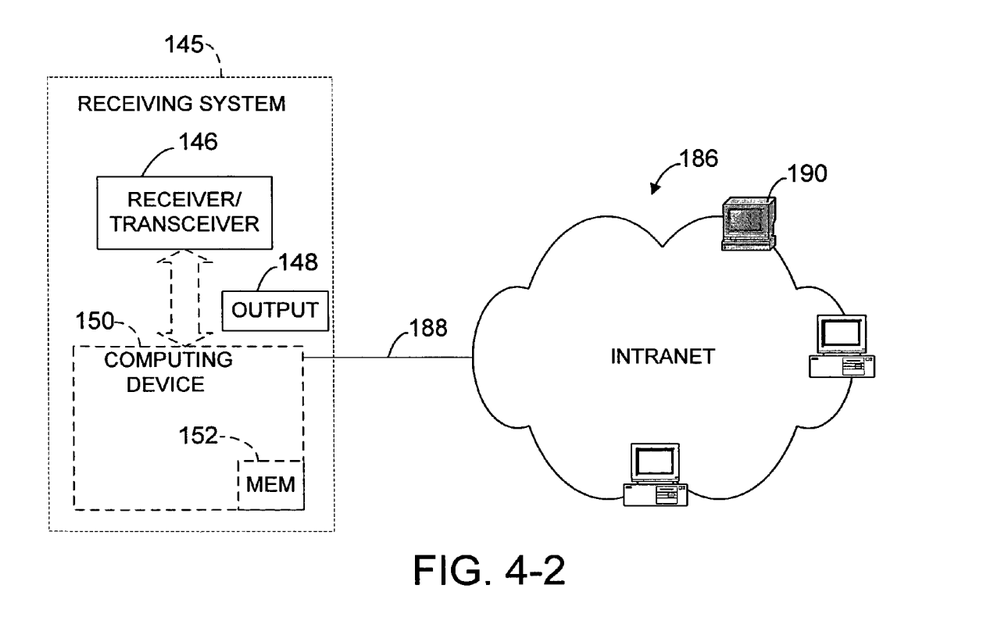

As mentioned above, receiving system 145 can be configured to couple into, for example, the Internet or an Intranet and serve as a web page that contains the battery test data. FIGS. 4-1 and 4-2 show receiving system 145 coupled to the Internet 180 (via Internet connection 182) and to Intranet 186 (via connection 188), respectively. An Internet user can view and operate receiving system screens form a computer 183, connected to the Internet 180, with the help of web browser 184. Similarly, receiving system screens can be accessed from a client computer 190, which is connected to Intranet 186. In some embodiments, cellular phone or paging networks can be used for transferring certain information between tester 116 and receiving system 145.

Referring back to FIG. 1, in another embodiment of the present invention, microprocessor 56 uses information input from input device 66 provided by, for example, an operator. This information may consist of various parameters of the particular type of battery, location, time, the name of the operator, observation data, etc. Additional information relating to the conditions of the battery test can also be received by microprocessor 56 from input device 66. Input device 66 may comprise one or more sensors, for example, or other elements which provide information such as ambient or battery temperature, time, date, humidity, barometric pressure, noise amplitude or characteristics of noise in the battery or in the test result, or any other information or data which may be sensed or otherwise recovered which relates to the conditions of the test, how the battery test was performed, or intermediate results obtained in conducting the test. Additional test condition information is provided by microprocessor 56. Such additional test condition information may include the values of $G_{BAT}$ and battery voltage, the various inputs provided to battery tester 16 by the operator which may include, for example, type of battery, estimated ambient or battery temperature, type of vehicle (i.e., such as provided through the Vehicle Identification Number (VIN) code for the vehicle)

or the particular sequence of steps taken by the operator in conducting the test. In accordance with the present invention, microprocessor 56 uses some, or all, of the various battery test condition information and combines such test condition information with the test result to generate a test or audit code.

Figure 5:
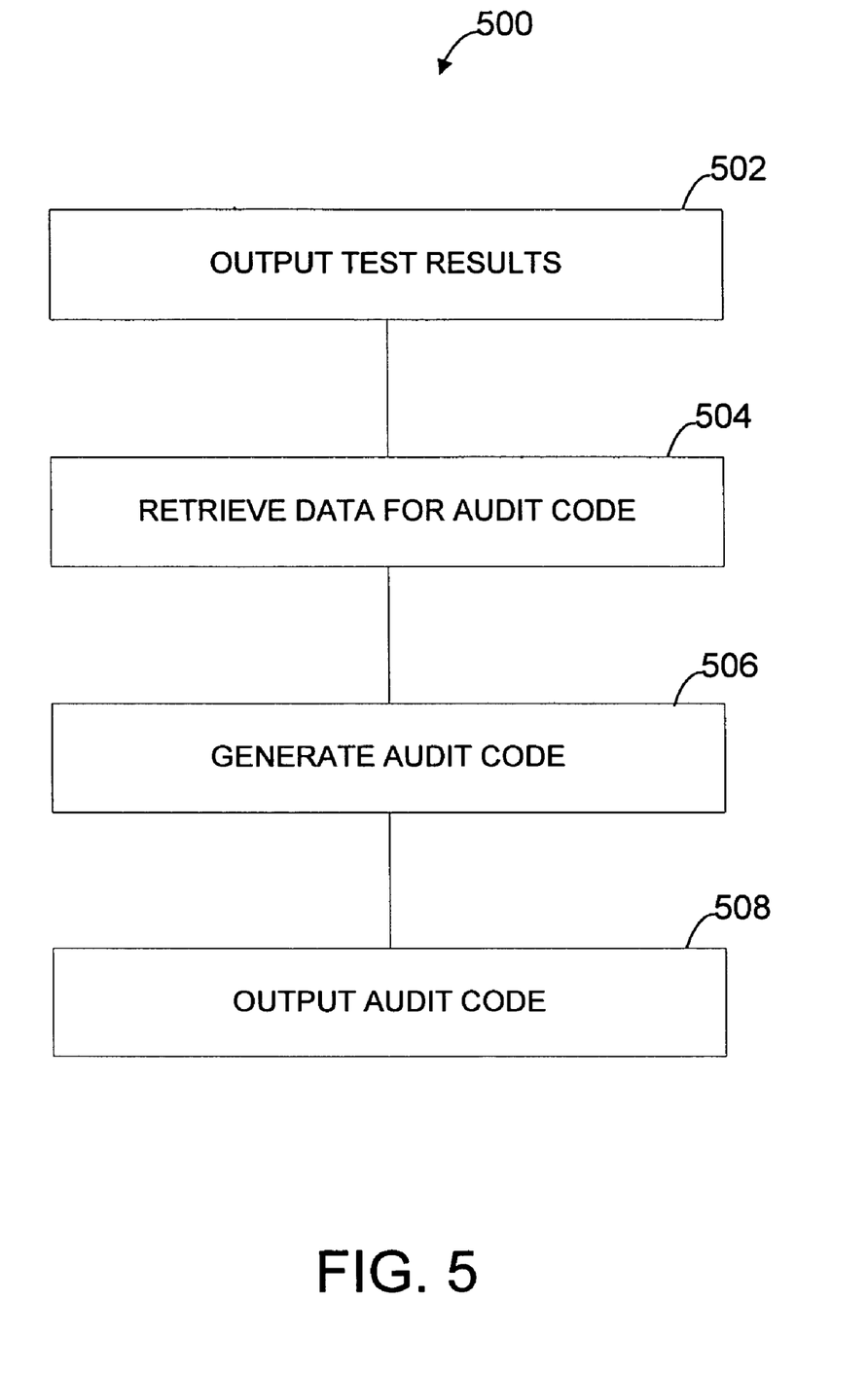
FIG. 5 is a simplified flow chart showing generation of an audit code in accordance with an embodiment of the present invention.

FIG. 5 is a simplified block diagram 500 showing steps in accordance with generation of an audit code of the present invention. The steps set forth in block diagram 500 are typically carried out by, for example, a microprocessor such as microprocessor 56 shown in FIG. 1. However, the steps may be implemented in hardware, software or their combination as appropriate.

Block 502 illustrates the general step of outputting test results. The test results can be, for example, the results of the battery test described above. At block 504, microprocessor 56 retrieves the data which will be used in the audit code. As discussed herein, such data can comprise many different types of data including data retrieved from memory 60 associated with microprocessor 56. At block 506, microprocessor 56 generates an audit code based upon the retrieved data in accordance with any of the embodiments set forth herein. The audit code is generated using an encryption algorithm. The particular algorithm used can be selected in accordance with the desired level of security. However, for most systems, a transposition offset cipher can be used in which individual data elements are transposed and offset by known amounts. More complex algorithms such as RSA, rotating codes or public key based encryption algorithms can be used if desired. At block 508, microprocessor 56 outputs the audit code, for example, to some sort of display device or printer coupled to microprocessor 56. In another embodiment of the present invention, microprocessor 56 can instruct communication circuitry 142, illustrated in FIG. 2, to wirelessly transmit the audit code to receiving system 145. Computing device 150 can then copy the audit code onto a return form, or enter the audit code into a database system of the manufacturer. The audit code and encryption algorithm should be such that the output is alphanumeric or in a form which is otherwise easy to copy onto a warranty submission form. Of course, if the code is electronically transmitted over wireless communication link 144, the audit code can take any form. Such wireless communication links include, for example, infrared links, ultrasonic links, RF outputs, or other techniques for conveying wireless data which are known in the art.

The particular data which is used to form the audit code can be any of the final test results or intermediary measurements (that is, measurements which are used to obtain a final test result) set forth herein. For example, the measured voltages can be encoded. Battery condition, state of charge or time to charge information can be encoded. Further, the date of the test can be maintained by a microprocessor and can be included in the audit code. Using this information, the test can be audited to determine if the measured voltage could actually result in the encoded test results. Further, by checking the encoded date, it is possible to determine whether the vehicle was even in a repair shop during the test period. The raw data, such as voltage levels or other intermediary measurements, can be used by a manufacturer to collect data regarding the operation of a product. For example, a manufacturer could note that a particular change to a battery resulted in a statistically significant drop in voltages as measured in actual vehicles. This could be used in a research and development effort to improve system operation.

Other information which can be encoded into the audit code includes information regarding the make or model of the vehicle or battery, information such as the VIN identifying the vehicle, temperature information, time of day information, an identification which specifies the operator, the identity of the dealer or shop performing the test, data which identifies the test equipment or the software used in the test equipment, system or component ratings or other information entered by an operator, the number or sequence of the test, or other information.

As noted above, embodiments of battery testers and receiving systems of the present invention include software that carries out various battery testing and information communication functions. In some embodiments of the present invention, tester 116 can also receive software updates through input device 143.

Figure 6:
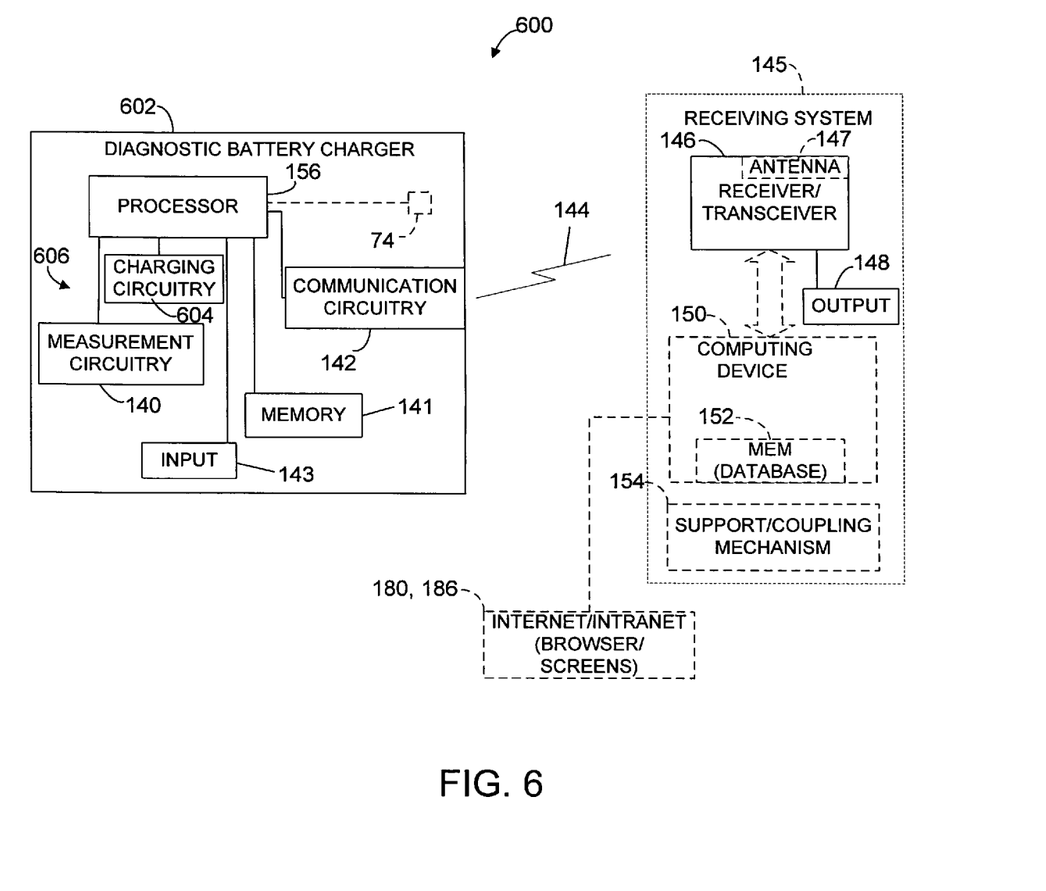
FIG. 6 is a simplified block diagram of a wireless diagnostic battery charging system in accordance with an embodiment of the present invention.

FIG. 6 is a simplified block diagram of a wireless diagnostic battery charging system 600 in accordance with an embodiment of the present invention. Wireless battery charging system 600 includes diagnostic battery charger 602, which includes battery charging circuitry 604. The remaining components of system 600 are similar to the components of system 100 shown in FIG. 2 and therefore denoted by the same reference numerals in FIG. 6. Temperature sensor 74 of FIG. 6 operates in a manner similar to the temperature sensor of FIG. 1. Charging circuitry 604, measurement circuitry 140 and microprocessor 156 together form battery charging and testing circuitry 606. Battery charging circuitry 604, which can include a transformer and rectifier, for example, is capable of supplying energy to a battery. Microprocessor 156, with the help of measurement circuitry 140, is capable of determining a battery charge status before, during and after the battery is charged by charging circuitry 604. In the embodiment shown in FIG. 6, microprocessor 156 is also capable of combining battery test data, battery charge status information, and other information related to the battery (such as battery temperature), into an encrypted code, which it provides to communication circuitry 142. The information combining and encryption process is carried out in a manner similar to that described above in connection with FIG. 5. A combination of battery test data and battery charging information is referred to herein as battery condition information. The transmission of information from communication circuitry 142 to receiving system 145 takes place in a manner described above in connection with FIG. 2.

Receiving system 145 of FIG. 6 can log and store battery condition information in memory 152, which can include at least one database with fields similar to those described above in connection with FIG. 3. A battery charging history can be stored in the database. Also, battery condition information can be viewed through the Internet 180 or an Intranet 180 in a manner described above in connection with FIGS. 4-1 and 4-1.

Diagnostic battery charger 602 can be any type of battery charger, which is capable of communicating battery condition information to an external receiver. A description of example components which can be employed to form battery charging and testing circuitry 606 is set forth in U.S. Pat. No. 6,104,167, issued Aug. 15, 2000, and entitled "METHOD AND APPARATUS FOR CHARGING A BATTERY," which is incorporated herein by reference.

Although the present invention has been described with reference to preferred embodiments, workers skilled in the art will recognize that changes may be made in form and detail without departing from the spirit and scope of the invention.

What is claimed is:

1. A method of testing a storage battery comprising:
connecting a battery test device to the storage battery;
obtaining, via an input of the battery test device, identification information for an operator carrying out the battery test;

obtaining, via the input of the battery test device, test condition information related to the battery;

obtaining battery measurement values by performing a step in a battery test on the storage battery with the battery test device;

digitizing the battery measurement values with the battery test device;

determining, using a microprocessor in the battery test device, a condition of the battery as a function of the digitized battery measurement values and the test condition information;

digitally combining the operator identification information, the test condition information, the digitized battery measurement values and the condition of the battery to form an encrypted code, the encrypted code having properties such that the operator identification information, the digitized battery measurement values and the condition of the battery are subsequently recoverable from the encrypted code and the battery test subsequently verifiable through comparing the measurement values to the condition of the battery to identify operator falsification of the battery test; and transmitting the encrypted code that combines the operator identification information, the test condition information, the digitized battery measurement values and the condition of the battery, across a wireless communication medium to an external receiver.

2. The method of claim 1 wherein determining the condition of the battery comprises computing a dynamic parameter of the battery.

3. The method of claim 2 wherein the dynamic parameter of the battery is a conductance of the battery.

4. The method of claim 1 wherein the encrypted code further comprises information related to a date that the battery test was performed.

5. An apparatus comprising:
battery test circuitry configured to couple to a battery and to generate battery measurement values;
an analog to digital converter configured to provide digitized measurement values;
input circuitry configured to receive operator identification information and test condition information related to a test condition of the storage battery;
a microprocessor configured to determine a condition of the storage battery as a function of the digitized measurement values and the test condition information, the microprocessor is further configured to generate an encrypted code that combines the operator identification information, the test condition information, the digitized battery measurement values and the condition of the battery, the encrypted code having properties such that the operator identification information, the digitized battery measurement values and the condition of the battery are subsequently recoverable from the encrypted code and the battery test subsequently verifiable through comparing the measurement values to the condition of the battery to identify operator falsification of the battery test; and
communication circuitry configured to transmit the encrypted code that combines the operator identification information, the test condition information, the digitized battery measurement values and the condition of the battery, across a wireless communication medium to an external receiver.

6. The apparatus of claim 5 wherein the communication circuitry utilizes radio frequency (RF) signals to transmit the encrypted code that combines the operator identification information, the test condition information, the digitized battery measurement values and the condition of the battery over the wireless communication medium.

7. The apparatus of claim 5 wherein the communication circuitry utilizes infrared (IR) signals to transmit the encrypted code that combines the operator identification information, the test condition information, the digitized battery measurement values and the condition of the battery over the wireless communication medium.

8. The apparatus of claim 5 wherein the microprocessor is configured to determine a dynamic parameter of the battery.

9. The apparatus of claim 8 wherein the dynamic parameter of the battery is a conductance of the battery.

10. The apparatus of claim 5 wherein the battery test circuitry comprises a temperature sensor that is configured to measure a temperature of the battery.

11. The apparatus of claim 10 wherein the communication circuitry is configured to transmit the measured temperature over the wireless communication medium.

12. The apparatus of claim 5 wherein the battery test circuitry is configured to receive software updates.

13. A receiving system comprising:
a receiver, having an antenna, configured to receive, over a wireless communication medium, a generated encryption code from a battery tester, the encrypted code combining operator identification information, test condition information, digitized battery measurement values and a condition of the battery, the encrypted code having properties such that the operator identification information, the digitized battery measurement values and the condition of the battery are subsequently recoverable from the encrypted code and the battery test subsequently verifiable through comparing the measurement values to the condition of the battery to identify operator falsification of the battery test; and
an output configured to provide information related to the condition of the battery.

14. The apparatus of claim 13 wherein the receiving system is portable.

15. The apparatus of claim 13 wherein the receiver is a RF receiver.

16. The apparatus of claim 13 and further comprising a computing device that is coupled to the receiver, the computing device is configured to at least temporarily store the operator identification information, the test condition information, the digitized battery measurement values and the condition of the battery.

17. The apparatus of claim 16 wherein the receiving system is configured to couple to an Internet connection.

18. The apparatus of claim 17 wherein the at least temporarily stored test data is accessible using a web browser.

19. The apparatus of claim 16 wherein the receiving system is configured to couple to an Intranet connection.

* * * * *